(12) United States Patent
Ohkubo

(10) Patent No.: US 7,430,228 B2
(45) Date of Patent: Sep. 30, 2008

(54) SEMICONDUCTOR LASER DEVICE AND METHOD OF PRODUCING THE SAME

(75) Inventor: Nobuhiro Ohkubo, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 376 days.

(21) Appl. No.: 10/896,026

(22) Filed: Jul. 22, 2004

(65) Prior Publication Data

US 2005/0018728 A1 Jan. 27, 2005

(30) Foreign Application Priority Data

Jul. 22, 2003 (JP) ............................. 2003-277410

(51) Int. Cl.
*H01S 5/00* (2006.01)
(52) U.S. Cl. .................. 372/46.01; 372/45.01
(58) Field of Classification Search .............. 372/46.01, 372/45.01
See application file for complete search history.

(56) References Cited

U.S. PATENT DOCUMENTS

| | | | | |
|---|---|---|---|---|
| 5,528,617 A | * | 6/1996 | Kobayashi et al. | 372/46.01 |
| 5,887,011 A | * | 3/1999 | Ohkura et al. | 372/46.01 |
| 6,127,691 A | * | 10/2000 | Fukunaga et al. | 257/17 |
| 6,278,137 B1 | * | 8/2001 | Shimoyama et al. | 257/102 |
| 6,580,736 B1 | * | 6/2003 | Yoshie et al. | 372/45.01 |
| 2004/0136427 A1 | * | 7/2004 | Hashimoto et al. | 372/46 |

FOREIGN PATENT DOCUMENTS

| JP | 03-208388 | 9/1991 |
|---|---|---|
| JP | 11-087831 | 3/1999 |

* cited by examiner

*Primary Examiner*—Minsun Harvey
*Assistant Examiner*—Phillip Nguyen
(74) *Attorney, Agent, or Firm*—Morrison & Foerster LLP

(57) ABSTRACT

In an AlGaInP semiconductor laser device, at least a first conductivity type first cladding layer, an active layer and a second conductivity type second cladding layer are formed on a semiconductor substrate. The second cladding layer forms a stripe-shaped ridge on a side opposite from the substrate, and a first conductivity type current block layer is disposed on both sides of the ridge. The first conductivity type current block layer has a lattice mismatch rate of –0.20% or more but not more than 0% relative to the semiconductor substrate. The lattice mismatch rate may be uniform within the current block layer. Alternatively, the lattice mismatch rate may increase continuously or stepwise with an increasing distance from a portion of the second conductivity type second cladding layer other than the ridge.

12 Claims, 15 Drawing Sheets

SEMICONDUCTOR LASER DEVICE AND METHOD OF PRODUCING THE SAME

This nonprovisional application claims priority under 35 U.S.C. §119(a) on Patent Application No(s). 2003-277410 filed in Japan on Jul. 22, 2003, the entire contents of which are hereby incorporated by reference.

BACKGROUND OF THE INVENTION

The present invention relates to a semiconductor laser device to be used for optical disks, and the like, and a method of producing the same. Particularly, the present invention relates to a semiconductor laser device having a window structure, which is superior in high power operation characteristics, and a method of producing the same.

In recent years, various types of semiconductor lasers have widely been used as light sources for optical disc devices. In particular, high-power semiconductor lasers have been used as light sources for writing information to disks in a DVD (digital versatile disc) player and a CD-RAM (random access memory) drive, and there is a need for reduction of driving current and further improvement in power.

One of factors that increase the driving current of a semiconductor laser is diffusion of impurity atoms from a cladding layer into an active layer. Further, one of factors that restrict increase in power of a semiconductor laser is catastrophic optical damage (COD), which tends to occur with increase of the optical power density in regions of an active layer in proximity of end faces of a laser cavity.

One method for reducing the driving current in a semiconductor laser device by suppressing the diffusion of impurity atoms into an active layer is adopted in a semiconductor light emitting device disclosed in Patent Document 1 (JP 11-87831 A). Further, as one method for increasing output power by reducing the COD level, there is a method utilizing a window structure in which an active layer of a multiquantum well structure is disordered, as adopted in a semiconductor laser disclosed in Patent Document 2 (JP 3-208388 A).

First, prior art for suppressing diffusion of impurity atoms into an active layer disclosed in Patent Document 1 will be described. FIG. 14 is a cross-sectional view showing an AlGaInP semiconductor laser device as a semiconductor light-emitting device disclosed in Patent Document 1.

In FIG. 14, reference numeral 1 denotes an n-type GaAs substrate, reference numeral 2 denotes an n-type $Al_{x1}Ga_{y1}In_{z1}P$ ($0 \leq x1$, y1, $z1 \leq 1$) cladding layer, reference numeral 3 denotes an $Al_{x2}Ga_{y2}In_{z2}P$ ($0 \leq x2$, y2, $z2 \leq 1$) optical waveguide layer (light guide layer), reference numeral 4 denotes a MQW structure active layer composed of $Ga_{y3}In_{z3}P$ ($0 \leq y3$, $z3 \leq 1$) quantum well layers (well layers) and $Al_{x2}Ga_{y2}In_{z2}P$ barrier layers, reference numeral 5 denotes an $Al_{x2}Ga_{y2}In_{z2}P$ optical waveguide layer (light guide layer), reference numeral 6 denotes a p-type $Al_{x1}Ga_{y1}In_{z1}P$ cladding layer, reference numeral 7 denotes a p-type GaInP intermediate layer, and reference numeral 8 denotes a GaAs cap layer. Reference numeral 10 denotes a p-side electrode, and reference numeral 11 denotes an n-side electrode.

An upper part of the p-type cladding layer 6, the p-type intermediate layer 7 and the p-type cap layer has a stripe shape extending in one direction, and both sides of the stripe portion are filled with an n-type GaAs current constriction layer (current block layer) 9. Se atoms are used as n-type conductivity impurities to be introduced into the n-type cladding layer 2 and the n-type current constriction layer 9, and Zn atoms are used as p-type conductivity impurities to be introduced into the p-type cladding layer 6, the p-type intermediate layer 7 and the p-type cap layer 8.

In the AlGaInP semiconductor laser device with the above construction, the n-type cladding layer 2 has a lattice mismatch rate of −0.15% or more but not more than −0.02% relative to the n-type substrate 1. The p-type cladding layer 6 has a lattice mismatch rate of 0.02% or more but not more than 0.3% relative to the n-type substrate 1.

Next, prior art for reducing the COD level disclosed in Patent Document 2 will be described. FIG. 15A and FIG. 15B are cross-sectional views showing the structure of a semiconductor laser device with a window structure disclosed in Patent Document 2.

FIG. 15A is a cross-sectional view of the semiconductor laser device in an excitation region (active region), and FIG. 15B is a cross-sectional view of the semiconductor laser device in an impurity diffusion region (window region). Reference numeral 21 denotes an n-type GaAs substrate, reference 22 denotes an n-type GaAs buffer layer, reference numeral 23 denotes an n-type AlGaInP cladding layer, reference numeral 24 denotes an undoped GaInP active layer, reference numeral 25 denotes a p-type AlGaInP inner cladding layer, reference numeral 27 denotes a p-type AlGaInP outer cladding layer, reference numeral 29 denotes a p-type GaAs cap layer, reference numeral 30 denotes a GaAs block layer, reference numeral 31 denotes a p-type GaAs contact layer, reference numeral 32 denotes a p-side electrode, and reference numeral 33 denotes an n-side electrode.

FIG. 16A through FIG. 16D are process drawings showing a conventional method of producing a semiconductor laser device disclosed in Patent Document 2. In accordance with FIG. 16A through FIG. 16D, the conventional method of producing a semiconductor laser device will be described.

As shown in FIG. 16A, an n-type GaAs buffer layer 22, an n-type AlGaInP cladding layer 23, an undoped GaInP active layer 24, a p-type AlGaInP inner cladding layer 25, a p-type GaInP etching stopper layer 26, a p-type AlGaInP outer cladding layer 27, a p-type GaInP hetero-barrier layer 28, and a p-type GaAs cap layer 29 are formed in sequence on an n-type GaAs substrate 21 at a growth temperature of 660° C. by an MOVPE (metal organic vapor phase epitaxy) method. Zn atoms are doped, as p-type impurities, into each of the layers having p-type conductivity from the p-type inner cladding layer 25 to the p-type cap layer 29.

Next, a dielectric film 34 is deposited on the p-type cap layer 29, and, after patterning the dielectric film in a stripe shape by photolithography, Zn atoms are diffused by a sealed tube diffusion method using $ZnAs_2$ as an impurity diffusion source. Thereby, highly concentrated Zn atoms are diffused into a region of the undoped active layer 24, which becomes an impurity diffusion region, so that the bandgap energy of the undoped active layer 24 increases.

Next, as shown in FIG. 16B, using the photolithography again, a resist stripe mask 35 is formed on the dielectric film 34 and the p-type cap layer 29. Thereafter, the dielectric film 34, the p-type cap layer 29, the p-type hetero-barrier layer 28 and the p-type outer cladding layer 27 are sequentially removed by a chemical etching treatment as shown in FIG. 16C, so as to form a ridge.

Next, as shown in FIG. 16D, after removing the resist stripe mask 35, using the dielectric film 34 as a mask, an n-type GaAs block layer 30 (see FIG. 15A and FIG. 15B) is selectively grown at a growth temperature of 660° C. by the MOVPE method. Thereby, the n-type block layer 30 is formed in regions on both sides of the ridge, and also on the impurity diffusion regions. Current injection into the regions where the n-type block layer 30 is formed is prevented.

Next, after removing the dielectric film 34, a p-type GaAs contact layer 31 is formed at a growth temperature of 660° C. by the MOVPE method (see FIGS. 15A and 15B). Thereafter, as shown in FIG. 15A and FIG. 15B, a p-side electrode 32 is formed on the p-type contact layer 31, and an n-side electrode 33 is formed on the underside of the n-type substrate 21. Then, the wafer is cleaved, and a semiconductor laser device shown in FIG. 15A and FIG. 15B is obtained.

However, the conventional semiconductor laser devices have the following problems. Specifically, in the semiconductor laser device disclosed in Patent Document 1 in which diffusion of impurity atoms into the active layer is suppressed, in order to suppress diffusion of Zn atoms contained in the p-type cladding layer 6 into the active layer 4, a strain is provided to the p-type cladding layer 6 so that the p-type cladding layer 6 has a lattice mismatch rate of 0.02% or more but not more than 0.3% relative to the n-type substrate 1.

However, in the conventional semiconductor laser device in which the diffusion of impurity atoms into the active layer is suppressed, mere provision of a strain in the p-type cladding layer 6 does not make it possible to sufficiently suppress diffusion of p-type conductivity impurity atoms (Zn atoms) contained in the p-type cladding layer 6 into the active layer 4. In the case where the p-type conductivity impurities contained in the cladding layer 6 are Be atoms, if a positive strain is applied to the p-type cladding layer 6, a large number of Be atoms are diffused into the active layer 4, which will invite an increase of driving current at high-power operation.

In the semiconductor laser device in which the diffusion of impurity atoms into the active layer is suppressed, laser light is prone to be absorbed in regions in proximity of end faces of a cavity, and therefore COD is liable to occur in regions of an active layer in proximity of the emission end faces. For that reason, a reduction of maximum optical output during high power operation is caused. Consequently, sufficient long-term reliability cannot be obtained.

In the semiconductor laser device having a conventional window structure, which is disclosed in Patent Document 2, diffusion of Zn atoms into the undoped active layer 24 is performed by the sealed tube diffusion method using, as an impurity diffusion source, $ZnAs_2$ containing Zn atoms having a relatively large diffusion constant with respect to AlGaInP materials, so that the bandgap energy of the impurity diffusion regions (window regions) is larger than the bandgap energy corresponding to the laser oscillation wavelength. Thereby, absorption of laser light in the regions in proximity of the cavity is suppressed, and the occurrence of COD in the regions of the active layer in proximity of the emission end faces is prevented.

However, in the semiconductor laser device with the conventional window structure, for the bandgap energy of the active layer in proximity of the emission end faces to be larger than the bandgap energy corresponding to the laser oscillation wavelength, Zn atoms are diffused into the impurity diffusion regions (window regions) of the undoped active layer 24 in proximity of end faces of the laser cavity, as described above. At this time, disadvantageously, a large number of Zn atoms present in the p-type inner cladding layer 25 are diffused even into the excitation region (active region) of the undoped active layer 24, which invites the increase of driving current at high-power operation and deterioration of long-term reliability.

SUMMARY OF THE INVENTION

It is an object of the invention to provide a semiconductor laser device having a reduced driving current at high-power operation and superior long-term reliability, and a method of producing the same.

In order to accomplish the above object, there is provided, according to an aspect of the present invention, an AlGaInP semiconductor laser device comprising at least a first conductivity type first cladding layer, an active layer and a second conductivity type second cladding layer formed on a semiconductor substrate, said second conductivity type second cladding layer having a stripe-shaped ridge on a side opposite from the substrate, said device having a first conductivity type current block layer formed on both lateral sides of the ridge, wherein the first conductivity type current block layer has a lattice mismatch rate of −0.20% or more but not more than 0% relative to the semiconductor substrate.

With the above construction, provision of a negative lattice mismatch to the first conductivity type current block layer indirectly imparts a negative strain to the second conductivity type second cladding layer. Consequently, a diffusion rate of impurity atoms having second conductivity present in the second cladding layer is reduced. As a result, the diffusion of impurity atoms having second conductivity into the active layer is reduced, so that driving current at a high-power operation is reduced. In that case, even if the second conductivity type impurity atoms are Be atoms, their diffusion rate is reduced, so that the diffusion of impurity atoms into the active layer is reduced.

In one embodiment, a photoluminescence peak wavelength of the active layer in a laser cavity end face proximity region is smaller than a photoluminescence peak wavelength of the active layer in a laser cavity internal region.

According to the embodiment, in the active layer in the laser cavity end face proximity region, a window region where there is no absorption of laser light is formed, so that COD in the active layer in the laser cavity end face proximity regions is suppressed. Therefore, a COD-free semiconductor laser device superior in long-term reliability in high power operation is obtainable.

In one embodiment, the lattice mismatch rate of the first conductivity type current block layer relative to the semiconductor substrate is uniform within the current block layer.

According to the above construction, a negative lattice mismatch is uniformly provided within the first conductivity type current block layer whereby a diffusion rate of impurity atoms having second conductivity present in the second conductivity type second cladding layer is reduced. As a result, the diffusion of impurity atoms having second conductivity into the active layer is reduced, so that driving current at a high-power operation is reduced.

In one embodiment, the lattice mismatch rate of the first conductivity type current block layer relative to the semiconductor substrate changes within the current block layer.

According to the embodiment, a negative strain is partially introduced by changing the negative lattice mismatch rate within the first conductivity type current block layer. This makes it possible to adjust the diffusion rate of impurity atoms having second conductivity present in the second conductivity type second cladding layer and to adjust the quantity of strain indirectly introduced into the active layer. As a result, driving current in a high-power operation is optimally reduced, and a semiconductor laser device superior in long-term reliability is obtainable.

In one embodiment, the lattice mismatch rate of the first conductivity type current block layer relative to the semiconductor substrate increases with an increasing distance thereof from a portion of the second conductivity type second cladding layer other than the ridge.

According to the embodiment, because the lattice mismatch rate of the first conductivity type current block layer decreases as the distance of the layer to the second conductivity type second cladding layer decreases. Thus, the quantity of strain indirectly introduced into the active layer is reduced while reducing the diffusion rate of impurity atoms having second conductivity present in the second conductivity type second cladding layer. Therefore, the diffusion of impurity atoms having the second conductivity into the active region is reduced, and deterioration of crystallinity in the active layer is suppressed. As a result, driving current in high-power is reduced, and a semiconductor laser device superior in long-term reliability is obtainable.

In one embodiment, the lattice mismatch rate of the first conductivity type current block layer changes stepwise within the current block layer.

According to the embodiment, a first conductivity type current block layer having a smaller lattice mismatch rate is disposed in proximity of the second conductivity type second cladding layer, and a first conductivity type current block layer having a larger lattice mismatch rate is disposed at a position away from the second cladding layer. This makes it easier to control the diffusion rate of impurity atoms having second conductivity present in the second cladding layer as well as to control the quantity of strain introduced into the active layer. Therefore, driving current in a high-power operation is reduced, and a semiconductor laser device superior in long-term reliability is stably obtained.

In one embodiment, the first conductivity type current block layer is composed of $Al_xIn_zP$ ($0 \leq x \leq 1$, $0 \leq z \leq 1$)

According to the embodiment, by controlling the mole fractions in the $Al_xIn_zP$, the lattice mismatch rate of the first conductivity type current block layer relative to the semiconductor substrate is controlled to a desired value. Therefore, driving current in high-power is reduced, and a semiconductor laser device superior in long-term reliability is stably obtained.

In one embodiment, the first conductivity type current block layer is composed of $Al_xIn_zAs_\alpha P_\beta$ ($0 \leq x \leq 1$, $0 \leq z \leq 1$, $0 \leq \alpha \leq 1$, $0 \leq \beta \leq 1$).

According to the embodiment, by controlling the mole fractions in the $Al_xIn_zAs_\alpha P_\beta$, the lattice mismatch rate of the first conductivity type current block layer relative to the semiconductor substrate is controlled to a desired value. Therefore, driving current in high-power is reduced, and a semiconductor laser device superior in long-term reliability is stably obtained.

In one embodiment, an Al mole fraction x and an In mole fraction z in the current block layer are fixed, and an As mole fraction α in the current block layer in proximity of the second conductivity type second cladding layer is 0.

According to the embodiment, the As mole fraction α in the first conductivity type $Al_xIn_zAs_\alpha P_\beta$ current block layer is changed so that the lattice mismatch rate increases with the increasing distance thereof from a portion of the second conductivity type second cladding layer other than the ridge, namely, in a direction substantially perpendicular to the substrate. Thus, the lattice mismatch rate of the $Al_xIn_zAs_\alpha P_\beta$ current block layer in proximity of the second cladding layer is smaller. In this manner, a negative strain to be introduced into the active layer is reduced although a negative strain is indirectly provided to the second cladding layer. Therefore, diffusion of impurity atoms having second conductivity into the active layer is reduced, and deterioration of crystallinity in the active layer is suppressed. As a result, driving current in high-power operation is reduced, and a semiconductor laser device superior in long-term reliability in high power operation is obtained.

In one embodiment, impurity atoms contained in the second conductivity type second cladding layer are Be atoms.

According to the embodiment, Be atoms having a smaller diffusion constant in the AlGaInP materials is used and therefore driving current in high-power operation is reduced, and a COD-free semiconductor laser device superior in long-term reliability in high power operation is obtained.

In one embodiment, the second conductivity type second cladding layer has a lattice mismatch rate of −0.15% or more but not more than 0.05% relative to the semiconductor substrate.

According to the embodiment, provision of a negative lattice mismatch in the first conductivity type current block layer indirectly imparts a negative strain into the second conductivity type second cladding layer. Furthermore, a negative lattice mismatch is introduced into the second cladding layer, so that the diffusion rate of impurity atoms having second conductivity present in the second cladding layer is further reduced. As a result, the diffusion of impurity atoms into the active layer is further reduced and driving current in high-power operation is further reduced.

In one embodiment, the lattice mismatch rate of the first conductivity type current block layer is smaller than a lattice mismatch rate of the second conductivity type second cladding layer.

According to the embodiment, a negative strain is effectively introduced into the second conductivity type second cladding layer, so that the diffusion rate of impurity atoms having second conductivity present in the second cladding layer is further reduced. As a result, the diffusion of impurity atoms into the active layer is more reduced, and driving current in high-power is further reduced.

According to another aspect of the present invention, there is provided a method of producing a semiconductor laser device, comprising:

forming a layered structure composed of AlGaInP materials including at least a first conductivity type first cladding layer, an active layer and a second conductivity type second cladding layer on a semiconductor substrate;

processing the second cladding layer on a side thereof opposite from the substrate into a stripe-shaped ridge; and filling both sides of the ridge with a first conductivity type current block layer having a lattice mismatch rate of −0.20% or more but not more than 0% relative to the semiconductor substrate.

With the above construction, provision of a negative lattice mismatch to the first conductivity type current block layer indirectly imparts a negative strain to the second conductivity type second cladding layer. Consequently, a diffusion rate of impurity atoms having second conductivity present in the second cladding layer is reduced. As a result, the diffusion of impurity atoms having second conductivity into the active layer is reduced, so that driving current at a high-power operation is reduced. In that case, even if the second conductivity type impurity atoms are Be atoms, their diffusion rate is reduced, so that the diffusion of impurity atoms into the active layer is reduced.

In one embodiment, Be atoms are contained in the second conductivity type second cladding layer as impurity atoms having second conductivity, and the method further comprises, after forming the layered structure and before forming the stripe-shaped ridge, forming an impurity diffusion source film containing Zn atoms having second conductivity in a laser cavity end face proximity region in a wafer having the layered structure; and annealing the wafer formed with the impurity diffusion source film such that Be atoms having second conductivity contained in the second conductivity type second cladding layer in the laser cavity end face proximity region and Zn atoms having second conductivity contained in the impurity diffusion source film in the laser cavity end face proximity region into the active layer in the laser cavity end face proximity region, to make a photoluminescence peak wavelength of the active layer in the laser cavity end face proximity region smaller than a photoluminescence peak wavelength of the active layer in a laser cavity internal region.

According to the embodiment, in the active layer in the laser cavity end face proximity region, a window region where substantially no laser light is absorbed is formed and therefore COD in the active layer in the laser cavity end face proximity region is suppressed. Therefore, driving current in high-power operation is reduced, and a COD-free semiconductor laser device superior in long-term reliability in high power operation is obtained.

In one embodiment, in the step of filling both sides of the ridge with the first conductivity type current block layer, $Al_xIn_zAs_\alpha P_\beta$ is used as the current block layer, and with Al mole fraction x and an In mole fraction z in the $Al_xIn_zAs_\alpha P_\beta$ being fixed, an As mole fraction α in the $Al_xIn_zAs_\alpha P_\beta$ is controlled to be increased with an increasing distance thereof from a portion of the second conductivity type second cladding layer other than the ridge.

According to the embodiment, the lattice mismatch rate of the $Al_xIn_zAs_\alpha P_\beta$ current block layer is small in proximity of portions of the second conductivity type second cladding layer positioned below the ridge. In this manner, a negative strain introduced into the active layer is alleviated in spite that a negative strain is indirectly imparted to the second cladding layer. Therefore, the diffusion of impurity atoms having second conductivity into the active layer is reduced, and deterioration of crystallinity in the active layer is suppressed. As a result, driving current in high-power operation is reduced, and a semiconductor laser device superior in long-term reliability in high power operation is obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The invention will hereinafter be described in detail by embodiments illustrated.

First Embodiment

Figure 1:
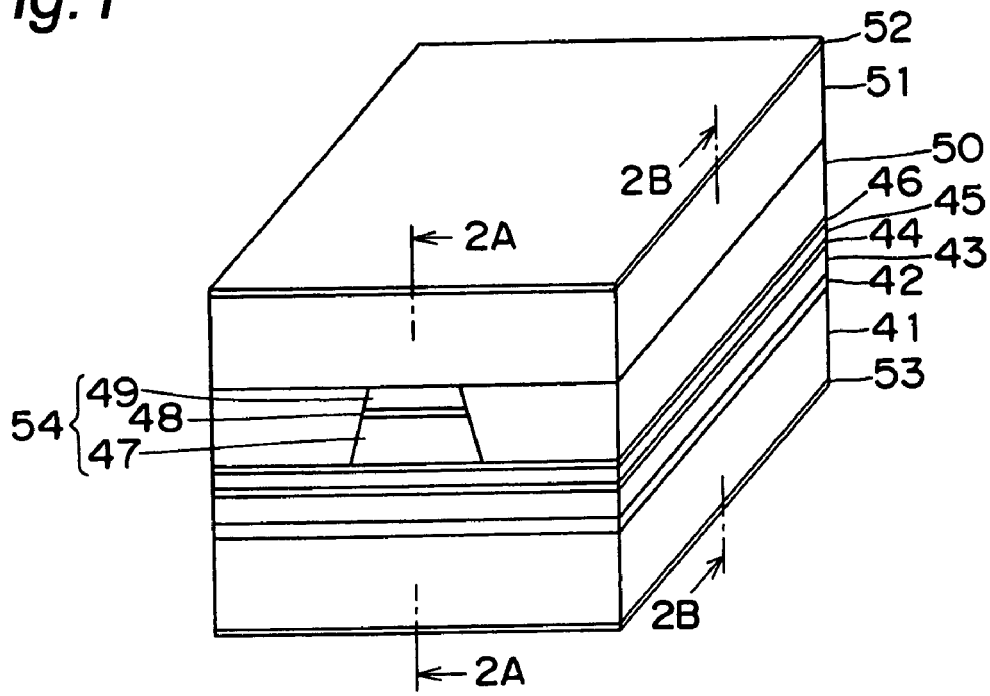
FIG. 1 is a perspective view of a semiconductor laser device according to a first embodiment of the present invention, showing a light emission end face of the device.
Figure 2A:
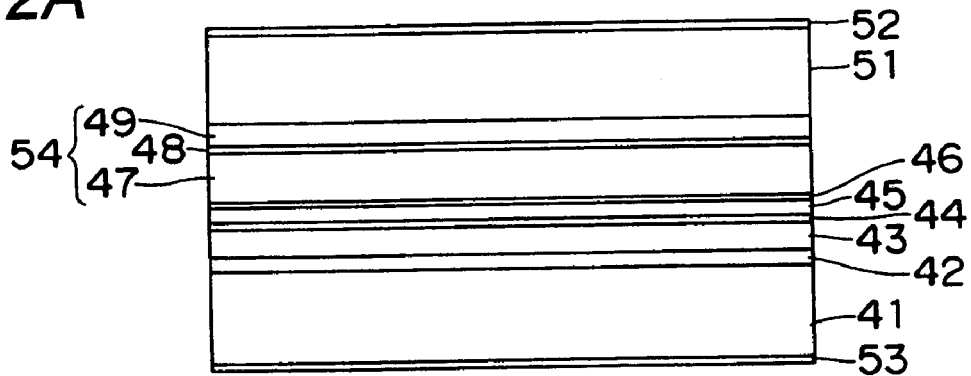
FIG. 2A is a cross-sectional view taken along line 2A-2A of FIG. 1.
Figure 2B:
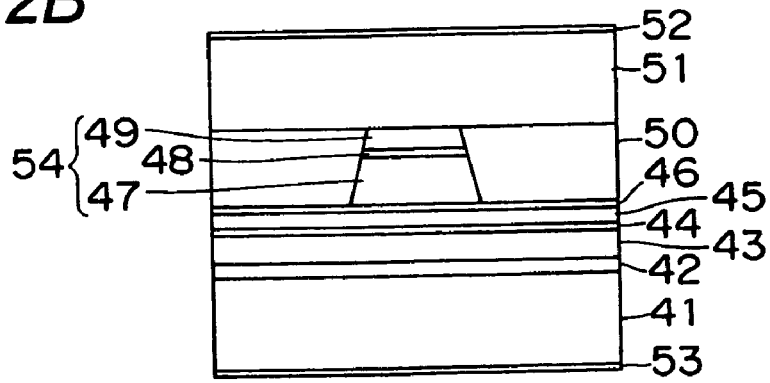
FIG. 2B is a cross-sectional view taken along line 2B-2B of FIG. 1.

FIG. 1 is a perspective view of a semiconductor laser device according to a first embodiment of the present invention, showing a light emission end face of the device. FIG. 2A is a cross-sectional view taken along line 2A-2A of FIG. 1, showing parts including a waveguide. And, FIG. 2B is a cross-sectional view taken along line 2B-2B of FIG. 1.

In FIG. 1, reference numeral 41 denotes an n-type GaAs substrate (carrier concentration: $2 \times 10^{18}$ cm$^{-3}$), reference numeral 42 denotes an n-type $Ga_yIn_zP$ (0≦y, z≦1) buffer layer (carrier concentration: $1 \times 10^{18}$ cm$^{-3}$, y=0.515, z=0.485, film thickness: about 0.2 μm), and reference numeral 43 denotes an n-type $Al_xGa_yIn_zP$ (0≦x≦1) first cladding layer (carrier concentration: $1 \times 10^{18}$ cm$^{-3}$, x=0.360, y=0.155, z=0.485, film thickness: about 2 μm) . Reference numeral 44 denotes an active layer (MQW active layer) constructed of a multiquantum well structure of alternating $Al_xGa_yIn_zP$ barrier layers (x=0.258, y=0.257, z=0.485; each having a film thickness of about 50 Å) and $Ga_yIn_zP$ well layers (y=0.485, z=0.515; each having a film thickness of about 50 Å), and two $Al_xGa_yIn_zP$ light guide layers (x=0.258, y=0.257, z=0.485; film thickness: about 500 Å) between which the multiquantum well structure is interposed.

Reference numeral 45 denotes a p-type $Al_xGa_yIn_zP$ second cladding layer (carrier concentration: $2 \times 10^{18}$ cm$^{-3}$, x=0.360, y=0.155, z=0.485, film thickness: about 0.1 μm), reference numeral 46 denotes a p-type etching stopper layer, reference numeral 47 denotes a p-type $Al_xGa_yIn_zP$ third cladding layer (carrier concentration: $2 \times 10^{18}$ cm$^{-3}$, x=0.360, y=0.155, z=0.485, film thickness: about 1.2 μm), reference numeral 48 denotes a p-type $Ga_yIn_zP$ intermediate layer (carrier concentration: $5 \times 10^{18}$ cm$^{-3}$, y=0.515, z=0.485, film thickness: about 0.05 μm), and reference numeral 49 denotes a p-type GaAs protective layer (carrier concentration: $1 \times 10^{19}$ cm$^{-3}$, film thickness: about 0.5 μm). In the present embodiment, the p-type $Al_xGa_yIn_zP$ second cladding layer 45 and the p-type $Al_xGa_yIn_zP$ third cladding layer 47 constitute the claimed second cladding layer.

The p-type third cladding layer 47, the p-type intermediate layer 48 and the p-type protective layer 49 constitute a stripe-shaped ridge 54. Si atoms are contained, as n-type impurities, in each of the layers from the n-type substrate 41 to the n-type first cladding layer 43, while Be atoms are contained, as p-type impurities, in each of the layers from the p-type second cladding layer 45 to the p-type protective layer 49.

Reference numeral 50 denotes an n-type $Al_xIn_zP$ current block (constriction) layer (carrier concentration: $1 \times 10^{18}$ cm$^{-3}$, x=0.538, z=0.462, film thickness: about 1.2 μm) The n-type current block layer 50 is formed so that both sides of the ridge 54 are filled with the n-type current block layer 50. Reference numeral 51 denotes a p-type GaAs contact layer (carrier concentration: $1 \times 10^{19}$ cm$^{-3}$, film thickness: about 4 μm), reference numeral 52 denotes a p-side electrode, and reference numeral 53 denotes an n-side electrode.

In the semiconductor laser device with the above construction, the n-type current block layer 50 uniformly has a lattice mismatch rate of −0.10% relative to the n-type substrate 41. In this case, the n-type current block layer 50 has a smaller lattice constant $a_2$ than the lattice constant $a_1$ of the n-type substrate 41 ($a_2 < a_1$).

In the semiconductor laser device, the n-type buffer layer 42, the p-type etching stopper layer 46, the p-type intermediate layer 48 and the p-type protective layer 49 have a lattice mismatch rate of 0% relative to the n-type substrate 41. In this case, these layers have a lattice constant $a_1$ equal to that of the n-type substrate 41.

In the semiconductor laser device, the n-type first cladding layer 43, the p-type second cladding layer 45 and the p-type third cladding layer 47 have a lattice mismatch rate of +0.05% relative to the n-type substrate 41. The barrier layers and the light guide layers constituting parts of the MQW active layer 44 have a lattice mismatch rate of +0.03% relative to the n-type substrate 41. The well layers constituting the other parts of the MQW active layer 44 have a lattice mismatch rate of +0.22% relative to the n-type substrate 41. In this case, lattice constants of the n-type first cladding layer 43, the barrier layers, the well layers, the light guide layers, the p-type second cladding layer 45, and the p-type third cladding layer 47 are larger than the lattice constant $a_1$ of the n-type substrate 41.

In the n-type current block layer 50, the lattice mismatch rate [Δa/a (%)] is given by adjusting an In mole fraction z of $Al_xIn_zP$ constituting the n-type current block layer 50.

Relationship between the lattice mismatch rate relative to the n-type GaAs substrate 41 and the Al, Ga, and In mole fractions will be described. The relational expression for calculating the lattice mismatch rate (Δa/a) relative to the n-type substrate 41 from the Al, Ga, and In mole fractions is given by equations (1) and (2) below:

$$\Delta a/a = -3.5912 + 7.4z + (0.13135 - 0.13z)x/(x+y) \quad (1)$$

$$x + y + z = 1 \quad (2)$$

The In mole fraction z of the n-type current block layer 50 for its lattice mismatch rate of 0% is z=0.476 because Δa/a=0 and y=0 in equations (1) and (2). Therefore, the composition of the n-type current block layer 50 is $Al_{0.524}In_{0.476}P$. On the other hand, the In mole fraction z of the n-type current block layer 50 in the case where the lattice mismatch rate is −0.10% is z=0.462 because Δa/a=−0.10 and y=0 in equations (1) and (2). Therefore, the composition of the n-type current block layer 50 is $Al_{0.538}In_{0.462}P$. That is, the In mole fraction $z_2$ in the case where the n-type $Al_xIn_zP$ current block layer 50 has a negative lattice mismatch rate relative to the n-type GaAs substrate 41 is smaller than the In mole fraction $z_1$ in the case where the n-type $Al_xIn_zP$ current block layer 50 is lattice matched with the n-type GaAs substrate 41 (i.e., the case where the lattice mismatch rate is 0%).

Figure 3A:
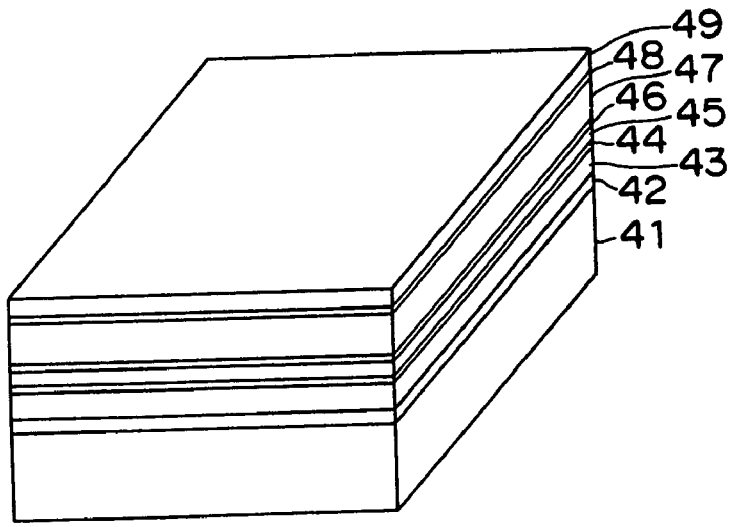
FIGS. 3A to 3E are cross-sectional views showing process steps in a method of producing the semiconductor laser device shown in FIG. 1.

Next, a method of producing a semiconductor laser device with the above constitution will be described in accordance with FIGS. 3A-3E. First, as shown in FIG. 3A, an n-type $Ga_yIn_zP$ buffer layer 42, an n-type $Al_xGa_yIn_zP$ first cladding layer 43, a MQW active layer 44, a p-type $Al_xGa_yIn_zP$ second cladding layer 45, a p-type etching stopper layer 46, a p-type $Al_xGa_yIn_zP$ third cladding layer 47, a p-type $Ga_yIn_zP$ intermediate layer 48 and a p-type GaAs protective layer 49 are sequentially grown on an n-type GaAs substrate 41 epitaxially by molecular beam epitaxy (MBE).

Figure 3B:
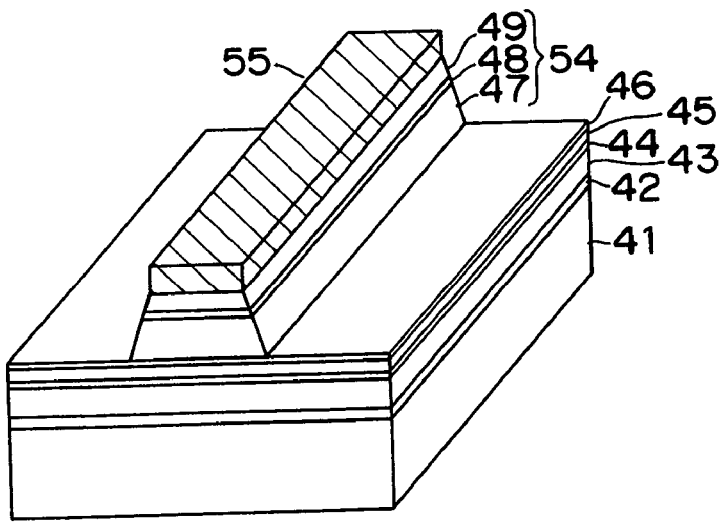

Next, using a known photolithography technique, a stripe-shaped resist mask 55 extending in a direction perpendicular to end faces of a laser cavity is formed on the p-type protective layer 49. Then, as shown in FIG. 3B, using a known etching technique, the p-type protective layer 49, the p-type intermediate layer 48 and the p-type third cladding layer 47 are etched until the p-type etching stopper layer 46 is reached, so that a stripe-shaped ridge 54 having a width of about 3 μm is formed.

Figure 3C:
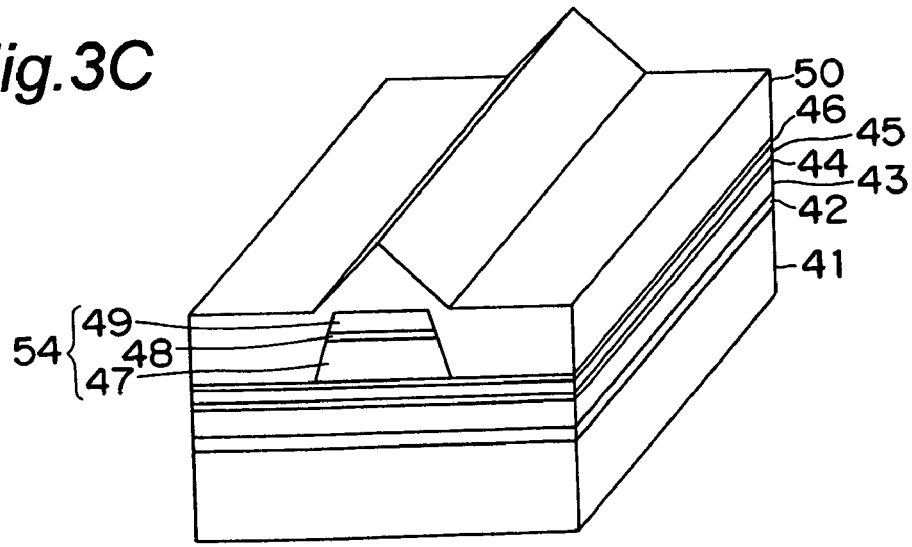

Next, the stripe-shaped resist mask 55 formed on the p-type protective layer 49 is removed, and both sides of the ridge 54 consisting of the p-type third cladding layer 47, the p-type intermediate layer 48 and the p-type protective layer 49 are filled with an n-type $Al_xIn_zP$ current block layer 50 grown by the second MBE process, as shown in FIG. 3C. At this time, the In mole fraction is adjusted so that the lattice mismatch rate of the n-type current block layer 50 relative to the n-type substrate 41 is uniform within the n-type current block layer 50.

Figure 3D:
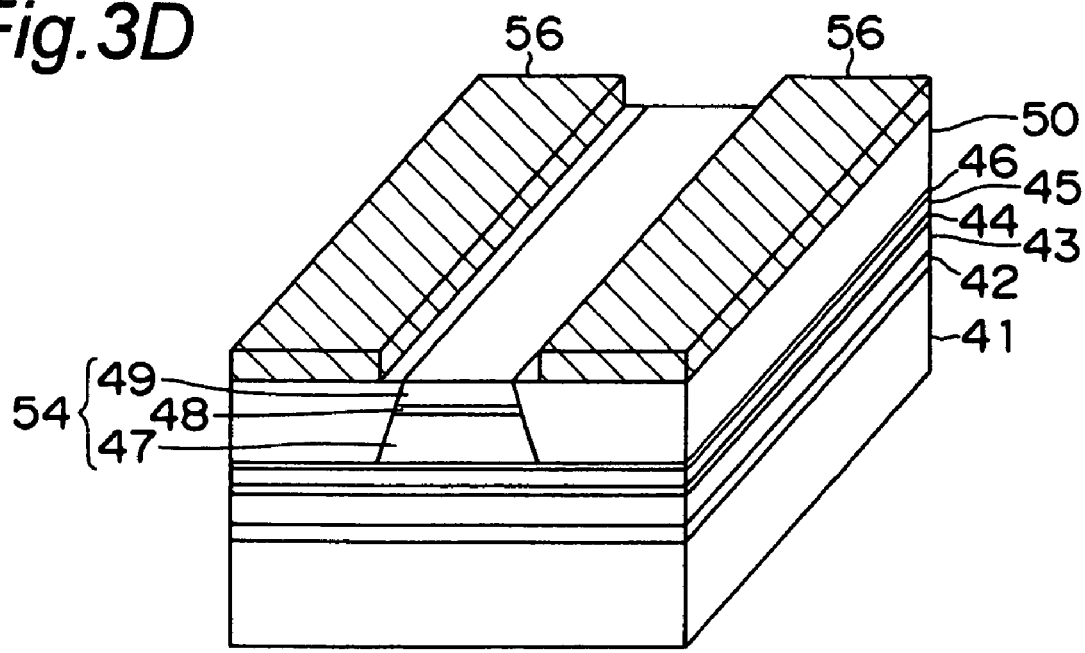
Figure 3E:
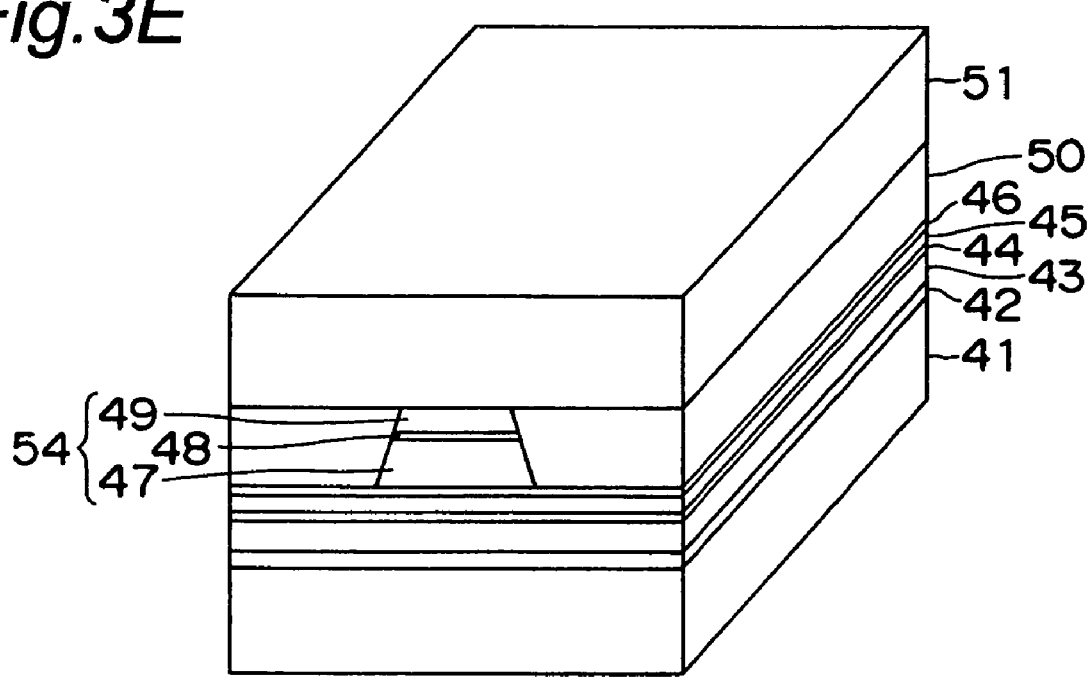

Thereafter, using a known photolithography technique, as shown in FIG. 3D, resist masks 56, 56 are formed on the n-type current block layer 50 formed on the sides of the ridge 54. Then, using a known etching technique, only a part of the n-type current block layer 50 that is present at an opening between the resist masks 56 is selectively etched. Next, the resist masks 56 formed on the n-type current block layer 50 are removed, and the third MBE process is performed to form a p-type GaAs contact layer 51 as shown in FIG. 3E. Furthermore, although not shown, a p-side electrode 52 is formed on the top of the p-type contact layer 51, and an n-side electrode 53 is formed on the underside of the n-type substrate 41.

After that, the wafer thus obtained is divided into bars such that the cavity length is 800 μm. Light emission end faces of each bar at both sides thereof are coated with a reflection film (not shown). Lastly, each bar is divided into chips to form individual semiconductor laser devices.

Evaluation of characteristics was conducted for the semiconductor laser devices formed by the production method in the present embodiment so that the lattice mismatch rate of the n-type current block layer 50 relative to the n-type substrate 41 was uniformly 0.10%. For comparison, 12 types of semiconductor laser devices in which the lattice mismatch rate of the n-type current block layer 50 relative to the n-type substrate 41 was uniformly −0.30%, −0.25%, −0.20%, −0.15%, −0.05%, 0%, +0.05%, +0.10%, +0.15%, +0.20%, +0.25% and +0.30%, respectively, were fabricated, and the measurement of characteristics of these devices was also conducted at the same time.

First, the oscillation wavelength (λ) at CW 50 mW was measured. As a result, both the semiconductor laser devices of the present embodiment and the 12 types of the semiconductor laser devices for comparison had an oscillation wavelength of 655 nm. Next, the driving current (Iop) at CW 50 mW of the semiconductor laser devices of the present embodiment and the 12 types of the semiconductor laser devices for comparison were measured.

Figure 4:
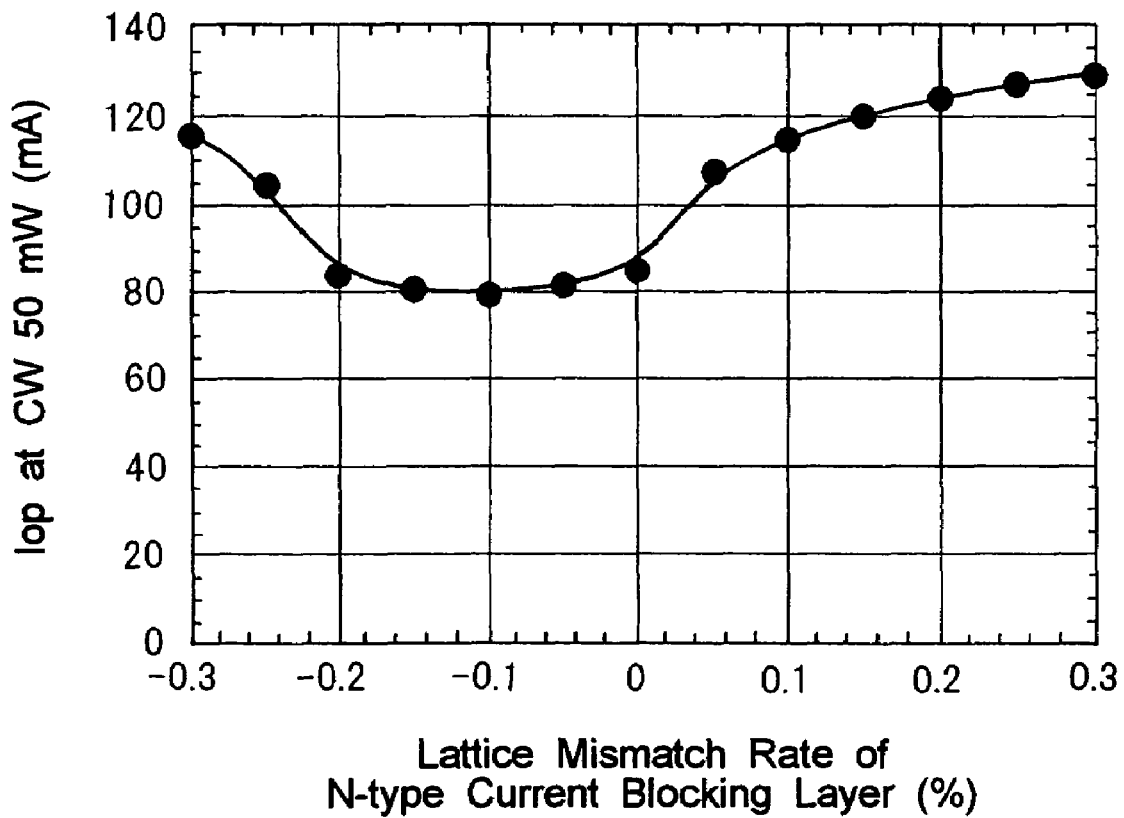
FIG. 4 is a graph showing the relationship between a lattice mismatch rate of an n-type AlInP current block layer relative to an n-type GaAs substrate and a driving current (Iop) at CW (continuous wave) 50 mW in the semiconductor laser device shown in FIG. 1 and semiconductor laser devices for comparison.

FIG. 4 shows the relationship between the lattice mismatch rate of the N-type current block layer 50 relative to the n-type substrate 41 and the driving current (Iop) at CW 50 mW regarding the semiconductor laser devices fabricated by the production method in the present embodiment and the 12 types of semiconductor laser devices for comparison. In FIG. 4, the axis of ordinates shows Iop (mA) at CW 50 mW, while the axis of abscissas shows the lattice mismatch rate (%) of the n-type current block layer 50 relative to the n-type substrate 41.

As seen from FIG. 4, in the range in which the lattice mismatch rate of the n-type current block layer 51 relative to the n-type substrate 41 is −0.20% or more but not more than 0%, the driving current (Iop) is as low as not more than 85 mA. On the other hand, in the range in which the lattice mismatch rate is less than −0.20%, or more than 0%, the driving current (Iop) suddenly increases.

By uniformly providing the negative lattice mismatch within the n-type current block layer 50, a negative strain is indirectly imparted to the p-type second cladding layer 45. As a result, the diffusion rate of impurity atoms (Be atoms) having p-type conductivity, which are present in the p-type second cladding layer 45, is lowered. Consequently, the diffusion of Be atoms into the MQW active layer 44 is reduced. Accordingly, the driving current (Iop) is lowered in the range in which the lattice mismatch rate is not more than 0%. However, in the case where the lattice mismatch rate of the n-type current block layer 50 relative to the n-type substrate 41 is less than −0.20%, the lattice of the n-type current block layer 50 is relaxed relative to the n-type substrate 41 and the p-type second cladding layer 45, so that the effect of the strain introduced into the p-type second cladding layer 45 disappears. Because of that, the diffusion of Be atoms into the active layer increases and the driving current (Iop) increases.

That is, if the lattice mismatch rate is in the range of from −0.20% to 0%, inclusive, the driving current (Iop) is as low as 85 mA or less. On the other hand, if the lattice mismatch rate is in the range of less than −0.20%, or more than 0%, the driving current (Iop) suddenly increases.

It can be seen from the above that reduction of the driving current is realized by setting the lattice mismatch rate of the n-type current block layer 50 relative to the n-type substrate 41 to the range of −0.20% or more but not more than 0%, preferably −0.15% or more but not more than −0.05%. This is why, in the semiconductor laser device of the present embodiment, in which the lattice mismatch rate of the entire n-type current block layer 50 is uniformly −0.10%, the driving current is reduced.

Second Embodiment

Figure 5:
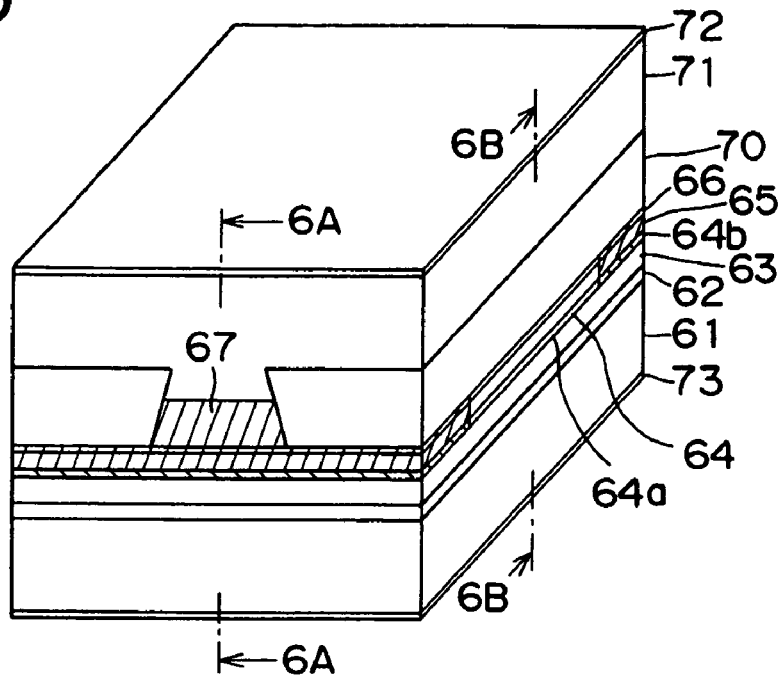
FIG. 5 is a perspective view of a semiconductor laser device according to a second embodiment of the present invention, showing a light emission end face of the device.
Figure 6A:
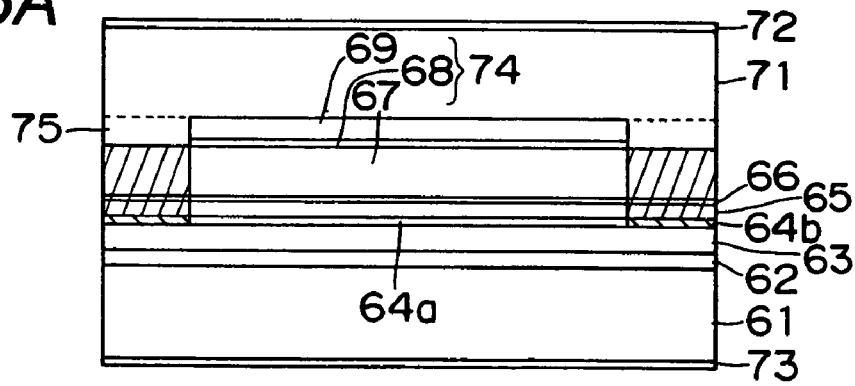
FIG. 6A is a cross-sectional view taken along line 6A-6A of FIG. 5.
Figure 6B:
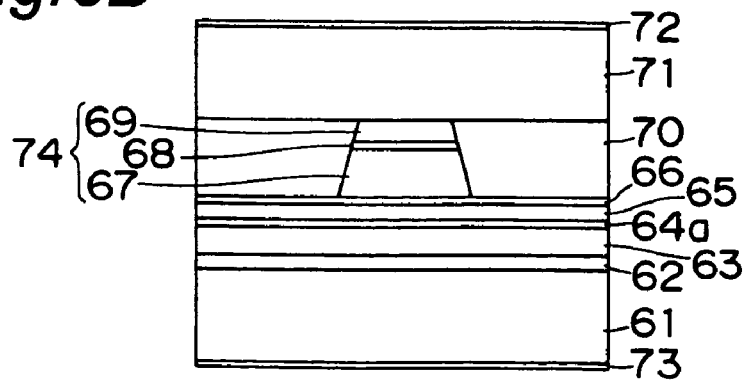
FIG. 6B is a cross-sectional view taken along line 6B-6B of FIG. 5.

FIG. 5 is a perspective view of a semiconductor laser device according to a second embodiment of the present invention, showing a light emission end face of the device. FIG. 6A is a cross-sectional view taken along line 6A-6A of FIG. 5, showing parts including a waveguide. And, FIG. 6B is a cross-sectional view taken along line 6B-6B of FIG. 5.

In FIG. 5, reference numeral 61 denotes an n-type GaAs substrate (carrier concentration: $2\times10^{18}$ cm$^{-3}$), reference numeral 62 denotes an n-type $Ga_yIn_zP$ ($0 \leq y, z \leq 1$) buffer layer (carrier concentration: $1\times10^{18}$ cm$^{-3}$, y=0.515, z=0.485, film thickness: about 0.2 μm), and reference numeral 63 denotes an n-type $Al_xGa_yIn_zP$ ($0 \leq x \leq 1$) first cladding layer (carrier concentration: $1\times10^{18}$ cm$^{-3}$, x=0.360, y=0.155, z=0.485, film thickness: about 2 μm). Reference numeral 64 denotes an active layer (MQW active layer) constructed of a multiquantum well structure of alternating $Al_xGa_yIn_zP$ barrier layers (x=0.258, y=0.257, z=0.485; each having a film thickness of about 50 Å) and $Ga_yIn_zP$ well layers (y=0.485, z=0.515; each having a film thickness of about 50 Å), and two $Al_xGa_yIn_zP$ light guide layers (x=0.258, y=0.257, z=0.485, film thickness: about 500 Å) between which the multiquantum well structure is interposed. Of the MQW active layer 64, reference numeral 64a denotes an MQW active layer region inside of a laser cavity (hereinafter referred to as "active region"), and reference numeral 64b denotes an MQW active layer region which is in proximity of an end face of the laser cavity and which has a photoluminescence peak wavelength smaller than that of the active region 64a (hereinafter referred to as "window region").

Reference numeral 65 denotes a p-type $Al_xGa_yIn_zP$ second cladding layer (carrier concentration: $2\times10^{18}$ cm$^{-3}$, x=0.370, y=0.158, z=0.472, film thickness: about 0.1 μm), reference numeral 66 denotes a p-type etching stopper layer, reference numeral 67 denotes a p-type $Al_xGa_yIn_zP$ third cladding layer (carrier concentration: $2\times10^{18}$ cm$^3$, x=0.370, y=0.158, z=0.472, film thickness: about 1.2 μm), reference numeral 68 denotes a p-type $Ga_yIn_zP$ intermediate layer (carrier concentration: $5\times10^{18}$ cm$^{-3}$, y=0.515, z=0.485, film thickness: about 0.05 μm), and reference numeral 69 denotes a p-type GaAs protective layer (carrier concentration: $1\times10^{19}$ cm$^{-3}$, film thickness: about 0.5 μm). That is, in the present embodiment, the p-type $Al_xGa_yIn_zP$ second cladding layer 65 and the p-type $Al_xGa_yIn_zP$ third cladding layer 67 constitute the claimed second cladding layer.

The p-type third cladding layer 67, the p-type intermediate layer 68 and the p-type protective layer 69 constitute a stripe-shaped ridge 74. Reference numeral 75 denotes a current non-injection region formed by removing the p-type intermediate layer 68 and the p-type protective layer 69. Si atoms are contained, as n-type impurities, in each of the layers from the n-type substrate 61 to the n-type first cladding layer 63, while Be atoms are contained, as p-type impurities, in each of the layers from the p-type second cladding layer 65 to the p-type protective layer 69.

Reference numeral 70 denotes an n-type $Al_xIn_zP$ current block (constriction) layer (carrier concentration: $1\times10^{18}$ cm$^{-3}$, x=0.538, z=0.462, film thickness: about 1.2 μm). The n-type current block layer 70 is formed so that both sides of the ridge 74 are filled with the n-type current block layer 70. Reference numeral 71 denotes a p-type GaAs contact layer (carrier concentration: $1 \times 10^{19}$ cm$^{-3}$, film thickness: about 4 µm), reference numeral 72 denotes a p-side electrode, and reference numeral 73 denotes an n-side electrode.

In the semiconductor laser device with the above construction, the p-type second cladding layer 65 and the p-type third cladding layer 67 have a lattice mismatch rate of −0.05% relative to the n-type substrate 61. The n-type current block layer 70 has a lattice mismatch rate of −0.10% relative to the n-type substrate 61. In this case, lattice constants of the p-type second cladding layer 65, the p-type third cladding layer 67 and the n-type current block layer 70 are smaller than the lattice constant of the n-type substrate 61.

In the semiconductor laser device, the n-type buffer layer 62, the p-type etching stopper layer 66, the p-type intermediate layer 68 and the p-type protective layer 69 have a lattice mismatch rate of 0% relative to the n-type substrate 61. In this case, these layers have a lattice constant a, equal to the lattice constant of the n-type substrate 61.

In the semiconductor laser device, the n-type first cladding layer 63 has a lattice mismatch rate of +0.05% relative to the n-type substrate 61. The barrier layers and the light guide layers constituting parts of the MQW active layer 64 have a lattice mismatch rate of +0.03% relative to the n-type substrate 61. The well layers constituting the other parts of the MQW active layer 64 have a lattice mismatch rate of +0.22% relative to the n-type substrate 61. In this case, lattice constants of the n-type first cladding layer 63, the barrier layers, the well layers, the light guide layers, the p-type second cladding layer 65 and the p-type third cladding layer 67 are larger than the lattice constant $a_1$ of the n-type substrate 61.

In the p-type second cladding layer 65 and the p-type third cladding layer 67, the lattice mismatch rate (Δa/a) is given by adjusting, in $Al_xGa_yIn_zP$ constituting these layers, the ratio of the Al mole fraction to the sum of the Al mole fraction and the Ga mole fraction (x/(x+y)) so that the ratio is always constant (i.e., x/(x+y)=0.7), and also adjusting the In mole fraction z.

In the case where the lattice mismatch rates of the p-type second cladding layer 65 and the p-type third cladding layer 67 are −0.05%, the Al mole fraction x, the Ga mole fraction y and the In mole fraction z in the p-type second and third cladding layers 65 and 67 are x=0.370, y=0.158, and z=0.472 because Δa/a=−0.050 and x/(x+y)=0.7 from equations (1) and (2) above. Therefore, the composition of the p-type second cladding layer 65 and the p-type third cladding layer 67 is $Al_{0.370}Ga_{0.158}In_{0.472}P$.

Figure 7A:
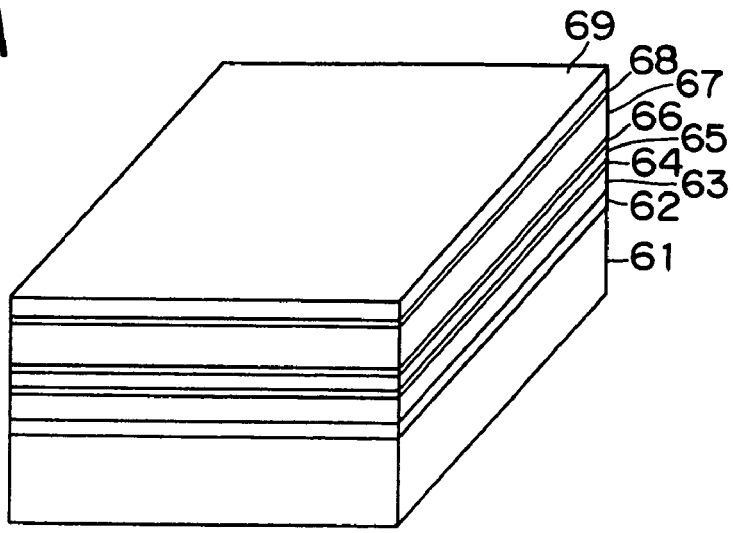
FIGS. 7A to 7F are cross-sectional views showing process steps in a method of producing the semiconductor laser device shown in FIG. 5.

Next, a method of producing a semiconductor laser device with the above constitution will be described in accordance with FIGS. 7A-7F. First, as shown in FIG. 7A, an n-type $Ga_yIn_zP$ buffer layer 62, an n-type $Al_xGa_yIn_zP$ first cladding layer 63, a MQW active layer 64, a p-type $Al_xGa_yIn_zP$ second cladding layer 65, a p-type etching stopper layer 66, a p-type $Al_xGa_yIn_zP$ third cladding layer 67, a p-type $Ga_yIn_zP$ intermediate layer 68 and a p-type GaAs protective layer 69 are epitaxially grown on an n-type GaAs substrate 61 by the molecular beam epitaxy (MBE) method.

In that case, the In mole fraction is controlled so that the lattice mismatch rates of the p-type second cladding layer 65 and the p-type third cladding layer 67 relative to the n-type GaAs substrate 61 are uniform in the p-type second cladding layer 65 and the p-type third cladding layer 67, respectively.

Figure 7B:
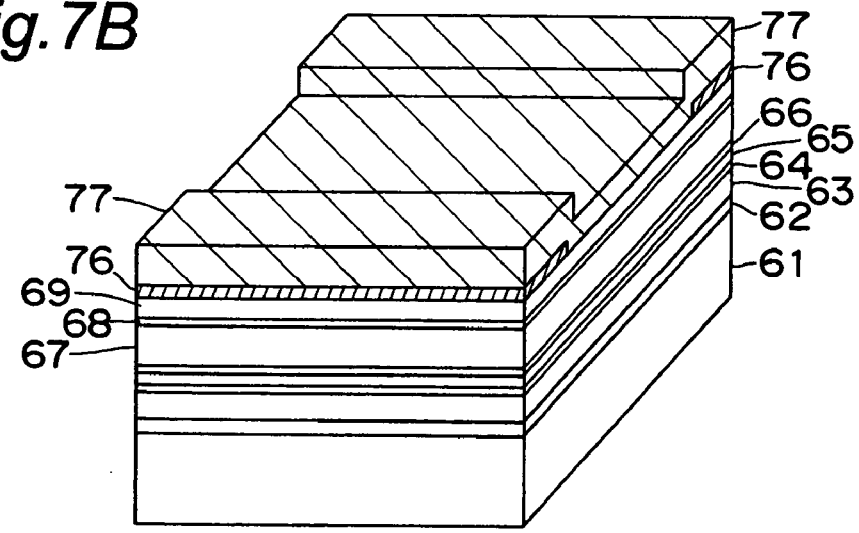

Next, using a known photolithography technique, a 60 µm wide stripe-shaped $Zn_vO_w$ (v, w≧1) film 76 serving as an impurity diffusion source is formed on a surface of the p-type protective layer 69 in regions in proximity of end faces of the laser cavity, as shown in FIG. 7B, in such a manner that the stripes of the film 76 extend in a direction perpendicular to the ridge stripe. The $Zn_vO_w$ film 76 has a film thickness of 35 nm, and the pitch of the stripes of the film 76 is 800 µm, which is the same as the cavity length. Then, a $Si_tO_u$ (t, u≧1) film 77 that is a dielectric film is formed on the entire surface of the wafer having the $Zn_vO_w$ film 76, to have a film thickness of 200 nm.

Next, annealing is performed on the wafer of which the surface is covered with the $Si_tO_u$ film 77 that is a dielectric film, in a nitrogen atmosphere under the condition that the temperature is 510° C. and the holding time is two hours. Thereby, in the laser cavity end face proximity regions, where the $Zn_vO_w$ impurity diffusion source film 76 is formed, Zn atoms from the $Zn_vO_w$ film 76 are let to be diffused into the MQW active layer 64. At the same time, Be atoms contained in each of the layers from the p-type second cladding layer 65 through the p-type protective layer 69 are also diffused into the MQW active layer 64 so that the photoluminescence peak wavelength of the MQW active layer (window regions) 64b in the laser cavity end face proximity regions is made smaller than that of the MQW active layer (active region) 64a in the laser cavity internal region.

Using a part of the wafer after forming the active region 64a and the window regions 64b in the MQW active layer 64 by the annealing, the wavelengths of the MQW active layer (window regions) 64b in the laser cavity end face proximity regions and the MQW active layer (active region) 64a in the laser cavity internal region were measured by the PL method. As a result, it was confirmed that the emission spectrum of the window region 64b was shifted to the short wavelength side by 38 nm from the emission spectrum of the active region 64a.

Figure 7C:
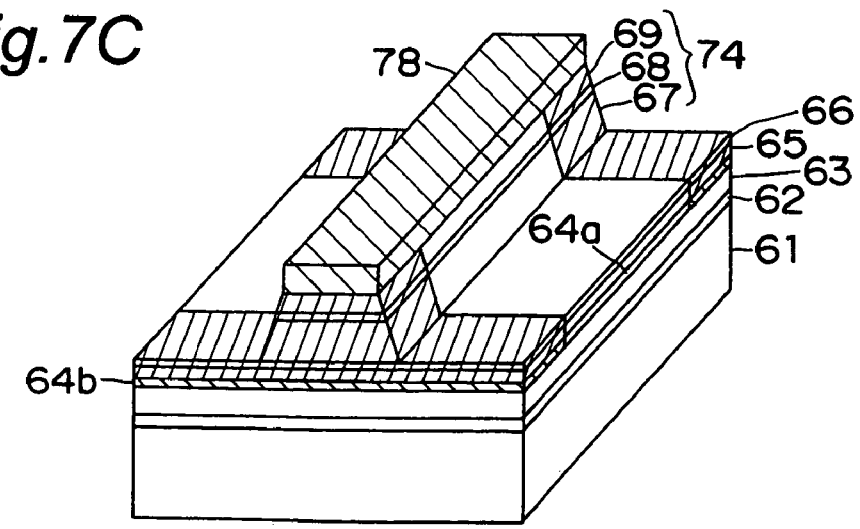

Thereafter, the $Zn_vO_w$ film 76 and the $Si_tO_u$ film 77 formed on the p-type protective layer 69 are removed, and using a known photolithography technique, a stripe-shaped resist mask 78 extending in a direction perpendicular to the end faces of the laser cavity is formed on the p-type protective layer 69 as shown in FIG. 7C. Then, using a known etching technique, the p-type protective layer 69, the p-type intermediate layer 68 and the p-type third cladding layer 67 are etched until the p-type etching stopper layer 66 is reached, to thereby form a stripe-shaped ridge 74 having a width of about 2 µm.

Figure 7D:
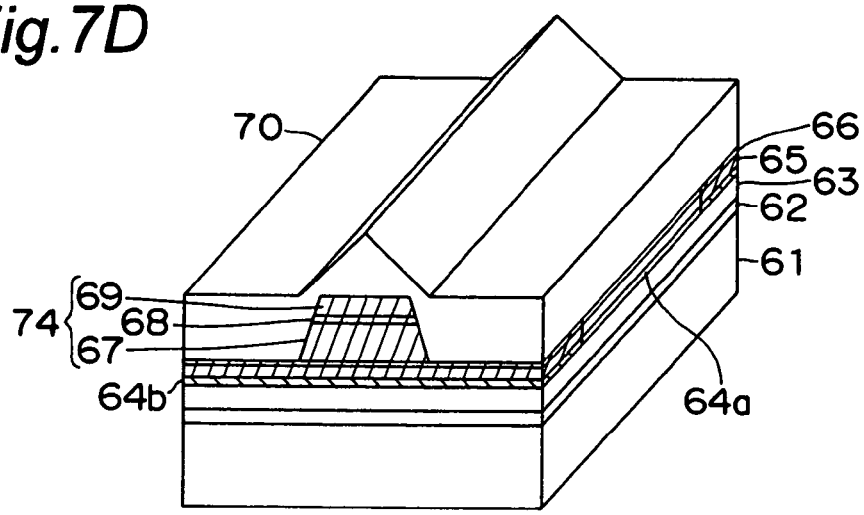

Next, the stripe-shaped resist mask 78 formed on the p-type protective layer 69 is removed, and both sides of the ridge 74 consisting of the p-type third cladding layer 67, the p-type intermediate layer 68 and the p-type protective layer 69 are filled with an n-type $Al_xIn_zP$ current block layer 70 by the second MBE process, as shown in FIG. 7D. At this time, the In mole fraction in $Al_xIn_zP$ is controlled so that the entire n-type current block layer 70 has a uniform lattice mismatch rate relative to the n-type substrate 61.

Figure 7E:
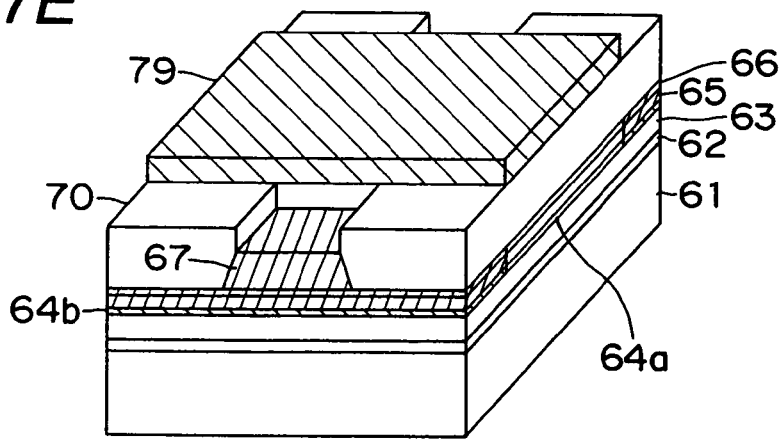

Thereafter, using a known photolithography technique, a resist mask (not shown) is formed on the n-type current block layer 70 at the lateral sides of the ridge 74. Then, using a known etching technique, only a part of the n-type current block layer 70 that is present at an opening of the resist mask and formed on the ridge 74 is selectively etched. After that, the resist mask formed on the n-type current block layer 70 is removed. Using the known photolithography technique again, a resist mask 79 is formed such that a 740 µm wide resist mask stripe is formed at the laser cavity internal region, as shown in FIG. 7E, and the p-type protective layer 69 and the p-type intermediate layer 68 in openings of the resist mask 79, which are located in the laser cavity end face proximity regions, are selectively removed. The openings of the resist mask 79 are formed so as to be positioned immediately above the MQW active layer (window regions) 64b in the laser cavity end face proximity regions.

Thereby, there will be a bandgap energy difference between the p-type third cladding layer 67 and a p-type contact layer 71 (to be formed later) in the laser cavity end face proximity regions, so that current non-injection regions 75 will be formed. The thus formed current non-injection regions 75 will be positioned immediately above the window regions 64b. Therefore, current injection into the widow regions 64b is prevented, and reactive current not contributing to light emission is reduced.

Figure 7F:
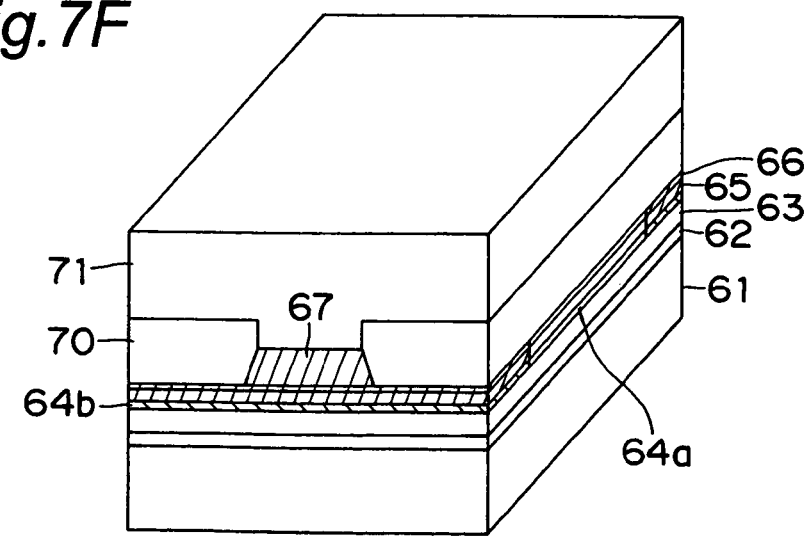

The resist mask 79 formed in the laser cavity internal region is then removed. Then, a p-type GaAs contact layer 71 is formed by the third MBE process, as shown in FIG. 7F. Further, although not shown, a p-side electrode 72 is formed on the top of the p-type contact layer 71, while an n-side electrode 73 is formed on the underside of the n-type substrate 61.

Next, the thus obtained wafer is scribed substantially at the center of the 60 µm wide laser cavity end face proximity regions, and divided into bars having the cavity length. Further, both sides of each bar serving as light emission end faces are coated with a reflection film. Then, the bars are divided into chips to form semiconductor laser devices each having about 30 µm wide window regions and current non-injection regions at the end faces of the laser cavity having a length of 800 µm.

Evaluation of characteristics was conducted for the semiconductor laser devices formed by the production method in the present embodiment so that the lattice mismatch rates of the p-type second cladding layer 65 and the p-type third cladding layer 67 relative to the n-type substrate 61 were uniformly −0.05%. For comparison, 8 types of semiconductor laser devices in which the lattice mismatch rates of the p-type second and third cladding layers 65 and 67 relative to the n-type substrate 61 were uniformly −0.20%, −0.15%, −0.10%, 0%, +0.05%, +0.10%, +0.15% and +0.20%, respectively, were fabricated, and the measurement of characteristics of these devices was also conducted at the same time.

First, the oscillation wavelength (λ) at CW 50 mW was measured. As a result, both the semiconductor laser devices of the present embodiment and the 8 types of the semiconductor laser devices for comparison had an oscillation wavelength of 660 nm. Further, as a result of maximum optical output experiments, neither the semiconductor laser devices of the present embodiment nor the semiconductor laser devices for comparison suffered from COD even at an optical output power of 300 mW or more.

From the above results, the following was confirmed. That is, in the semiconductor laser devices of the present embodiment in which the photoluminescence peak wavelength of the window regions 64b is smaller than that of the active region 64a, regions where laser light absorption is prevented are formed in the window regions 64b and as a result, the occurrence of COD in the window regions 64b is suppressed.

Next, driving currents (Iop) at CW 50 mW of the semiconductor laser devices of the present embodiment and the 8 types of semiconductor laser devices for comparison were measured.

Figure 8:
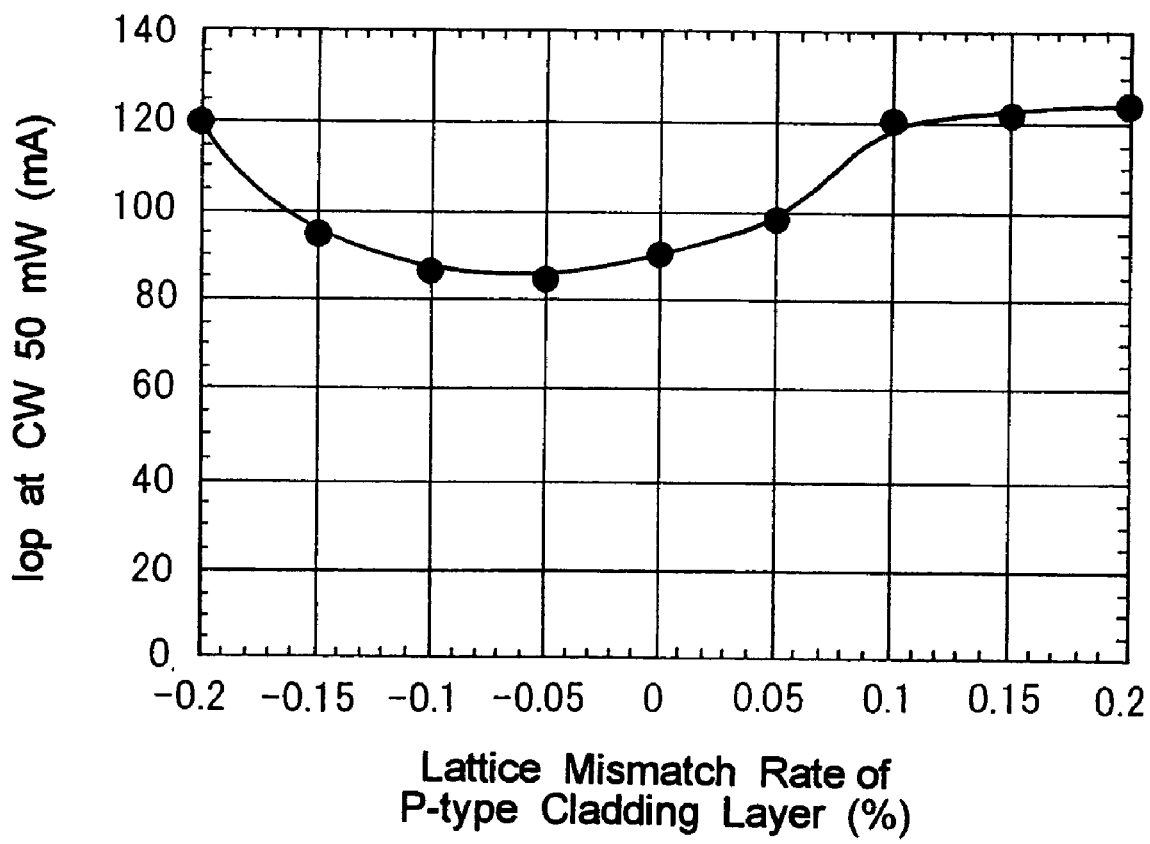
FIG. 8 is a diagram showing the relationship between a lattice mismatch rate of p-type AlGaInP second and third cladding layers relative to an n-type GaAs substrate and a driving current (Iop) at CW 50 mW in the semiconductor laser device shown in FIG. 5 and semiconductor laser devices for comparison.

FIG. 8 shows the relationship between the lattice mismatch rate of the p-type second and third cladding layer 65 and 67 relative to the n-type substrate 61 and the driving current (Iop) at CW 50 mW regarding the semiconductor laser devices fabricated by the production method in the present embodiment and the 8 types of semiconductor laser devices for comparison. In FIG. 8, the axis of ordinates shows Iop (mA) at CW 50 mW, while the axis of abscissas shows the lattice mismatch rate (%) of the p-type second and third cladding layers 65 and 67 relative to the n-type substrate 61.

As seen from FIG. 8, in the range in which the lattice mismatch rates of the p-type second cladding layer 65 and the p-type third cladding layer 67 relative to the n-type substrate 61 are −0.15% or more but not more than +0.05%, the driving current (Iop) is as low as not more than 100 mA. On the other hand, in the range in which the lattice mismatch rates thereof are less than −0.15%, or more than +0.05%, the driving current (Iop) suddenly increases.

By providing the negative lattice mismatch within the n-type current block layer 70, a negative strain is indirectly imparted to the p-type second cladding layer 65. For that reason, the diffusion rate of Be atoms present in the p-type second cladding layer 65 is reduced. Furthermore, by providing the negative lattice mismatch in the p-type second cladding layer 65 and the p-type third cladding layer 67, the diffusion rate of Be atoms present in the p-type second cladding layer 65 is further reduced. As a result, diffusion of Be atoms into the MQW active layer 64 is reduced. Therefore, in the range in which the lattice mismatch rate is not more than 0%, the driving current (Iop) is reduced. However, in the case where the lattice mismatch rates of the p-type second cladding layer 65 and the p-type third cladding layer 67 relative to the n-type substrate 61 are less than −0.15%, crystal defects are developed in the MQW active layer 64 due to the negative strain in the n-type current block layer 70 and the p-type second cladding layer 65. Therefore, the driving current (Iop) suddenly increases. Furthermore, in the case where the lattice mismatch rates of the p-type second cladding layer 65 and the p-type third cladding layer 67 relative to the n-type substrate 61 are more than +0.05%, the effect of strain introduced into the p-type second cladding layer 65 is reduced. Because of that, diffusion of Be atoms into the active layer increases.

That is, if the lattice mismatch rate is in the range of from −0.15% to +0.05%, inclusive, the driving current (Iop) is as low as 100 mA or less. On the other hand, if the lattice mismatch rate is in the range of less than −0.15%, or more than +0.05%, the driving current (Iop) suddenly increases.

It can be seen from the above that reduction of the driving current is realized by setting the lattice mismatch rates of the p-type second cladding layer 65 and the p-type third cladding layer 67 relative to the n-type substrate 61 to the range of −0.15% or more but not more than 0.05%, preferably −0.10% or more but not more than 0%. This is why, in the semiconductor laser device of the present embodiment in which the lattice mismatch rates of the p-type second cladding layer 65 and the p-type third cladding layer 67 relative to the n-type current block layer 61 are −0.05%, the driving current is reduced.

In the semiconductor laser device having a window structure of the present embodiment, wherein the photoluminescence peak wavelength of the MQW active layer (window regions) 64b in the laser cavity end face proximity regions is made smaller than that of the MQW active layer (active region) 64a in the laser cavity internal region, the lattice mismatch rates of the p-type second cladding layer 65 and the p-type third cladding layer 67 relative to the n-type substrate 61 are set to −0.05%. However, the invention is not limited to this. The reduction of the driving current can be realized also by a semiconductor laser device of the first embodiment if the lattice mismatch rates of the p-type second cladding layer 45 and the p-type third cladding layer 47 relative to the n-type substrate 41 are set to the range of −0.15% or more but not more than +0.05%, preferably −0.10% or more but not more than 0%.

In the present embodiment, the lattice mismatch rate of the n-type current block layer 70 is uniformly −0.10% within the n-type current block layer 70. However, if the lattice mismatch rate of the n-type $Al_xIn_zP$ current block layer 70 relative to the n-type substrate 61 is in the range of −0.20% or more but not more than 0%, preferably −0.15% or more but not more than −0.05%, the same effect as that of the present embodiment can be obtained.

Third Embodiment

Figure 9:
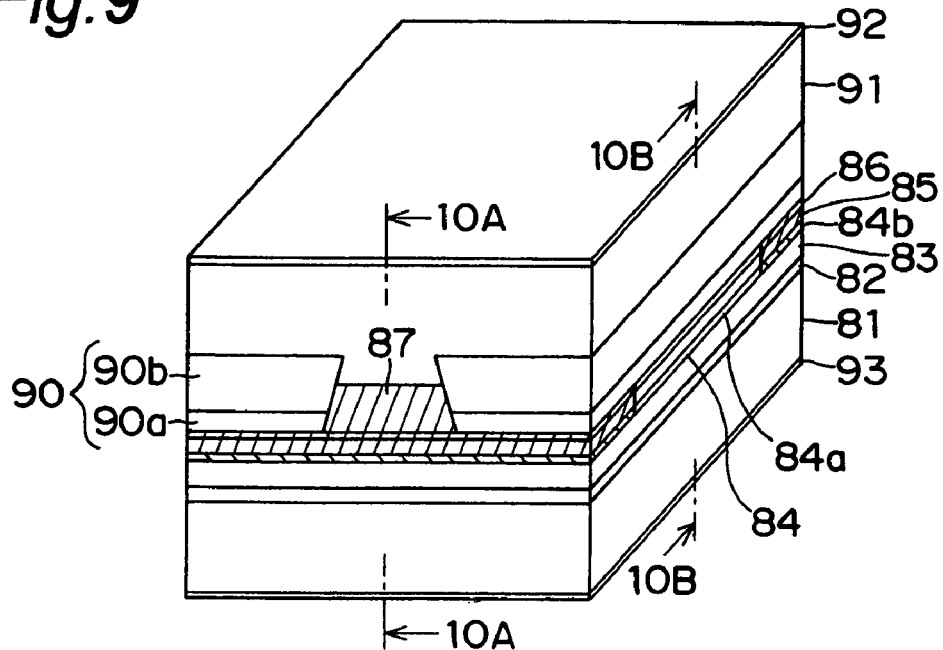
FIG. 9 is a perspective view of a semiconductor laser device according to a third embodiment of the present invention, showing a light emission end face of the device.
Figure 10A:
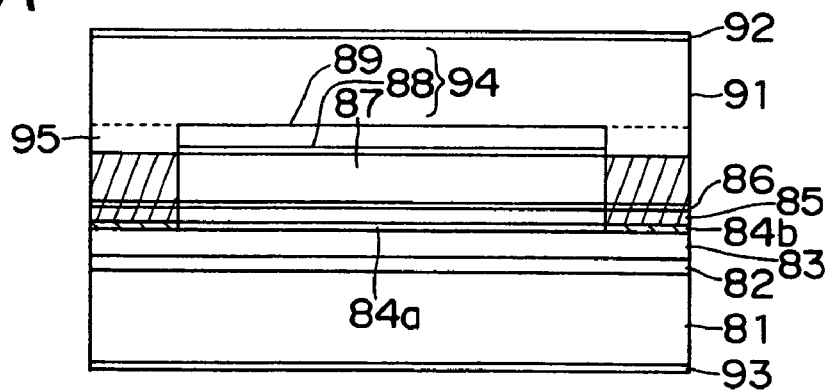
FIG. 10A is a cross-sectional view, taken along line 10A-10A of FIG. 9.
Figure 10B:
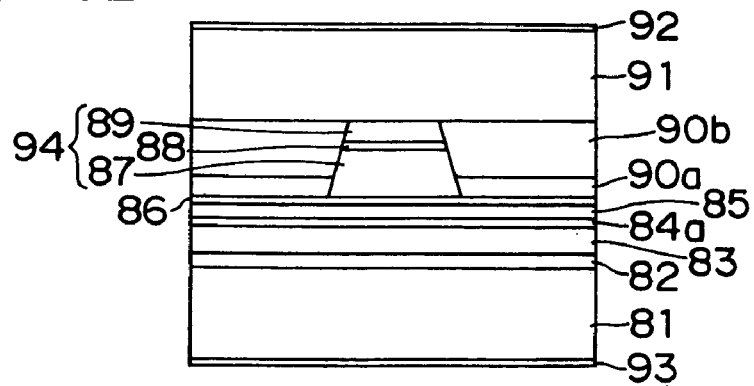
FIG. 10B is a cross-sectional view, taken along line 10B-10B of FIG. 9.

FIG. 9 is a perspective view of a semiconductor laser device according to a second embodiment of the present invention, showing a light emission end face of the device. FIG. 10A is a cross-sectional view taken along line 10A-10A of FIG. 9, showing parts including a waveguide. And, FIG. 10B is a cross-sectional view taken along line 10B-10B of FIG. 9.

In FIG. 9, reference numeral 81 denotes an n-type GaAs substrate (carrier concentration: $2\times10^{18}$ cm$^{-3}$), reference numeral 82 denotes an n-type $Ga_yIn_zP$ ($0 \leq y$, $z \leq 1$) buffer layer (carrier concentration: $1\times10^{18}$ cm$^{-3}$, y=0.515, z=0.485, film thickness: about 0.2 μm), and reference numeral 83 denotes an n-type $Al_xGa_yIn_zP$ ($0 \leq x \leq 1$) first cladding layer (carrier concentration: $1\times10^{18}$ cm$^{-3}$, x=0.360, y=0.155, z=0.485, film thickness: about 2 μm). Reference numeral 84 denotes an active layer (MQW active layer) constructed of a multiquantum well structure of alternating $Al_xGa_yIn_zP$ barrier layers (x=0.258, y=0.257, z=0.485; each having a film thickness of about 50 Å) and $Ga_yIn_zP$ well layers (y=0.485, z=0.515; each having a film thickness of about 50 Å), and two $Al_xGa_yIn_zP$ light guide layers (x=0.258, y=0.257, z=0.485, film thickness: about 500 Å) between which the multiquantum well structure is interposed. Of the MQW active layer 84, reference numeral 84a denotes an MQW active layer region inside of a laser cavity (hereinafter referred to as "active region"), and reference numeral 84b denotes an MQW active layer region which is in proximity of an end face of the laser cavity and which has a photoluminescence peak wavelength smaller than that of the active region 84a (hereinafter referred to as "window region").

Reference numeral 85 denotes a p-type $Al_xGa_yIn_zP$ second cladding layer (carrier concentration: $2\times10^{18}$ cm$^{-3}$, x=0.370, y=0.158, z=0.472, film thickness: about 0.1 μm), reference numeral 86 denotes a p-type etching stopper layer, reference numeral 87 denotes a p-type $Al_xGa_yIn_zP$ third cladding layer (carrier concentration: $2\times10^{18}$ cm$^{-3}$, x=0.370, y=0.158, z=0.472, film thickness: about 1.2 μm), reference numeral 88 denotes a p-type $Ga_yIn_zP$ intermediate layer (carrier concentration: $5\times10^{18}$ cm$^{-3}$, y=0.515, z=0.485, film thickness: about 0.05 μm), and reference numeral 89 denotes a p-type GaAs protective layer (carrier concentration: $1\times10^{19}$ cm$^{-3}$, film thickness: about 0.5 μm). That is, in the present embodiment, the p-type $Al_xGa_yIn_zP$ second cladding layer 85 and the p-type $Al_xGa_yIn_zP$ third cladding layer 87 constitute the claimed second cladding layer.

The p-type third cladding layer 87, the p-type intermediate layer 88 and the p-type protective layer 89 constitute a stripe-shaped ridge 94. Reference numeral 95 denotes current non-injection regions formed by removing the p-type intermediate layer 88 and the p-type protective layer 89. Si atoms are contained, as n-type impurities, in each of the layers from the n-type substrate 81 to the n-type first cladding layer 83, while Be atoms are contained, as p-type impurities, in each of the layers from the p-type second cladding layer 85 to the p-type protective layer 89.

Reference numeral 90 denotes a current block (constriction) layer that is formed so that both sides of the ridge stripe 94 are filled with the current block layer 90. The current block layer 90 consists of an n-type $Al_xIn_zP$ first current block layer 90a (carrier concentration: $1\times10^{18}$ cm$^{-3}$, x=0.545, z=0.455, film thickness: about 0.3 μm) and an n-type $Al_xIn_zP$ second current block layer 90b (carrier concentration: $1\times10^{18}$ cm$^{-3}$, x=0.531, z=0.469, film thickness: about 0.9 μm). Reference numeral 91 denotes a p-type GaAs contact layer (carrier concentration: $1\times10^{19}$ cm$^{-3}$, film thickness: about 4 μm), reference numeral 92 denotes a p-side electrode, and reference numeral 93 denotes an n-side electrode.

In the semiconductor laser device, the n-type first current block layer 90a has a lattice mismatch rate of −0.15% relative to the n-type substrate, and the n-type second current block layer 90b has a lattice mismatch rate of −0.05% relative to the n-type substrate 81. That is, the lattice mismatch rate of the current block layer increases stepwise with the increasing distance from the p-type second cladding layer 85 in a direction substantially perpendicular to the n-type substrate 81. In this case, lattice constants of the n-type first current block layer 90a and the n-type second current block layer 90b are smaller than a lattice constant of the n-type substrate 81, and the lattice constant of the n-type first current block layer 90a is less far from the lattice constant of the n-type substrate 81 than the lattice constant of the n-type second current block layer 90b is.

In the semiconductor laser device, the p-type second cladding layer 85 and the p-type third cladding layer 87 have a lattice mismatch rate of −0.05% relative to the n-type substrate 81. In this case, lattice constants of the p-type second cladding layer 85 and the p-type third cladding layer 87 are smaller than the lattice constant of the n-type substrate 81.

In the semiconductor laser device, the n-type buffer layer 82, the p-type etching stopper layer 86, the p-type intermediate layer 88 and the p-type protective layer 89 have a lattice mismatch rate of 0% relative to the n-type substrate 81. In this case, these layers have a lattice constant $a_1$ equal to that of the n-type substrate 81.

In the semiconductor laser device, the n-type first cladding layer 83 has a lattice mismatch rate of +0.05% relative to the n-type substrate 81. The barrier layers and the light guide layers constituting parts of the MQW active layer 84 have a lattice mismatch rate of +0.03% relative to the n-type substrate 81. The well layers constituting the other parts of the MQW active layer 84 have a lattice mismatch rate of +0.22% relative to the n-type substrate 81. In this case, lattice constants of the n-type first cladding layer 83, the barrier layers, the well layers, the light guide layers, the p-type second cladding layer 85 and the p-type third cladding layer 87 are larger than the lattice constant of the n-type substrate 81.

In the p-type second cladding layer 65 and the p-type third cladding layer 67, the lattice mismatch rate ($\Delta a/a$) is given by adjusting, in $Al_xGa_yIn_zP$ constituting these layers, the ratio of the Al mole fraction to the sum of the Al mole fraction and the Ga mole fraction (x/(x+y)) so that the ratio is always constant (i.e., x/(x+y)=0.7), and also adjusting the In mole fraction z. Furthermore, in the n-type first current block layer 90a and the n-type second current block layer 90b, the lattice mismatch rate ($\Delta a/a$) is given by adjusting the In mole fraction z in $Al_xIn_zP$ constituting these layers.

In the case where the lattice mismatch rates of the p-type second cladding layer 85 and the p-type third cladding layer 87 are −0.05%, the Al mole fraction x, the Ga mole fraction y and the In mole fraction z in the p-type second and third cladding layers 85 and 87 are x=0.370, y=0.158, and z=0.472 because $\Delta a/a$=−0.050 and x/(x+y)=0.7 from equations (1) and (2) above. Therefore, the composition of the p-type second cladding layer 85 and the p-type third cladding layer 87 is $Al_{0.370}Ga_{0.158}In_{0.472}P$.

On the other hand, the In mole fraction z in the n-type first current block layer 90a having the lattice mismatch rate of −0.15% is z=0.455 because Δa/a=−0.15 and y=0 from equations (1) and (2). Therefore, the composition of the n-type first current block layer 90a is $Al_{0.545}In_{0.455}P$. Further, the In mole fraction z in the n-type second current block layer 90b having the lattice mismatch rate of −0.05% is z=0.469 because Δa/a=−0.05 and y=0 from equations (1) and (2). Therefore, the composition of the n-type second current block layer 90b is $Al_{0.531}In_{0.469}P$.

The measurement of characteristics of semiconductor laser devices of the present embodiment was conducted. For comparison, the measurement of characteristics of semiconductor laser devices of the second embodiment was also conducted. First, the oscillation wavelength (λ) at CW 50 mW was measured. As a result, both the semiconductor laser devices of the present embodiment and the semiconductor laser devices of the second embodiment had an oscillation wavelength of 660 nm. Next, the driving current (Iop) at CW 50 mW was measured. As a result, both the semiconductor laser devices of the present embodiment and the semiconductor laser devices of the second embodiment had a driving current (Iop) of 85 mA. Maximum optical output tests were conducted. As a result, neither the semiconductor laser devices of the present embodiment nor the semiconductor laser devices of the second embodiment suffered from COD even at an optical output power of 300 mW or more.

Furthermore, reliability tests at 70° C. and 50 mW were conducted on the semiconductor laser devices. While the semiconductor laser devices of the second embodiment had an average lifetime of about 2000 hours, the semiconductor laser devices of the present embodiment had an average lifetime of about 3000 hours, demonstrating that the average lifetime has improved.

It can be understood from the above that in a semiconductor laser device wherein the lattice mismatch rates of the n-type first current block layer 90a and the n-type second current block layer 90b relative to the. n-type substrate 81 are −0.15% and −0.05%, respectively, so that the lattice mismatch rate of the current block layer 90 increases stepwise as a whole as the distance from the p-type second cladding layer 85 increases, as in the present embodiment, reduction of driving current and further improvement in long-term reliability have been realized.

The reduction of the driving current and the further improvement in the long-term reliability are realized by the following reason. That is, the n-type first current block layer 90a whose lattice mismatch rate is smaller is disposed in the vicinity of the p-type second cladding layer 85, while at a position farther away from the p-type second cladding layer 85, the n-type first current block layer 90b whose lattice mismatch rate is larger is disposed, whereby a negative strain introduced into the MQW active layer 84 can be reduced while a negative strain is indirectly imparted to the p-type second cladding layer 85. As a result, the diffusion of Be atoms into the active layer is reduced, and deterioration of crystallinity in the MQW active layer 84 is suppressed.

In the present embodiment, the lattice mismatch rates of the n-type first current block layer 90a and the n-type second current block layer 90b relative to the n-type substrate 81 are set to −0.15% and −0.05%, respectively, so that the lattice mismatch rate of the current block layer 90 increases stepwise as a whole as the distance thereof from the p-type second cladding layer 85 increases. However, the effect of the present embodiment can also be obtained by setting the lattice mismatch rates of the n-type first current block layer 90a and the n-type second current block layer 90b relative to the n-type substrate 81 to fall within the range of −0.20% or more but not more than 0%, preferably within the range of −0.15% or more but not more than −0.05%, and also adjusting the lattice mismatch rate of the current block layer 90 such that it increases stepwise as the current block layer 90 goes farther from the p-type second cladding layer 85.

In the present embodiment, the n-type first and second current block layers 90a, 90b are composed of $Al_xIn_zP$, although the effect of the present embodiment can also be obtained if the above layers are composed of $Al_xIn_zAs_\alpha P_\beta$ (0≦α, β≦1). Further, the effect of the present embodiment can also be obtained if the n-type first current block layer 90a is composed of $Al_xIn_zP$, and the n-type second current block layer 90b is composed of $Al_xIn_zAs_\alpha P_\beta$.

In the present embodiment, the n-type current block layer consists of two layers having different lattice mismatch rates relative to the n-type substrate 81. However, the effect of the present embodiment can also be obtained if the n-type current block layer consists of three or more layers having different lattice mismatch rates relative to the n-type substrate 81, if the lattice mismatch rate of each layer is set within the range of −0.20% or more but not more than 0%, preferably −0.15% or more but not more than −0.05%, and if the lattice mismatch rates of the three or more layers are adjusted such that the layer at a larger distance from the p-type second cladding layer 85 has a larger lattice mismatch rate so that the lattice mismatch rate of the current block layer increases stepwise as a whole.

According to the present embodiment, in a window structure semiconductor laser device in which the photoluminescence peak wavelength of the MQW active layer (window regions) 84b in the laser cavity end face proximity regions is made smaller than that of the MQW active layer (active region) 84a in the laser cavity internal region, the lattice mismatch rate of the n-type first current block layer 90a relative to the n-type substrate 81 is set to −0.15%, the lattice mismatch rate of the n-type second current block layer 90b relative to the n-type substrate 81 is set to −0.05%, so that the lattice mismatch rate increases stepwise as the distance of the current block layer from the p-type $Al_xGa_yIn_zP$ second cladding layer 85 increases. However, the invention is not limited to this, and in the semiconductor laser device of the first embodiment as well, the n-type current block layer 50 can be formed in two layers, and the lattice mismatch rates of the n-type first and second current block layers relative to the n-type substrate 41 are set within the range of −0.20% or more but not more than 0%, preferably −0.15% or more but not more than 0.05% such that the lattice mismatch rate of the n-type current block layer 50 increases stepwise with the increasing distance thereof from the p-type second cladding layer 45. As a result, reduction of the driving current and improvement in the long-term reliability can be realized.

Fourth Embodiment

Figure 11:
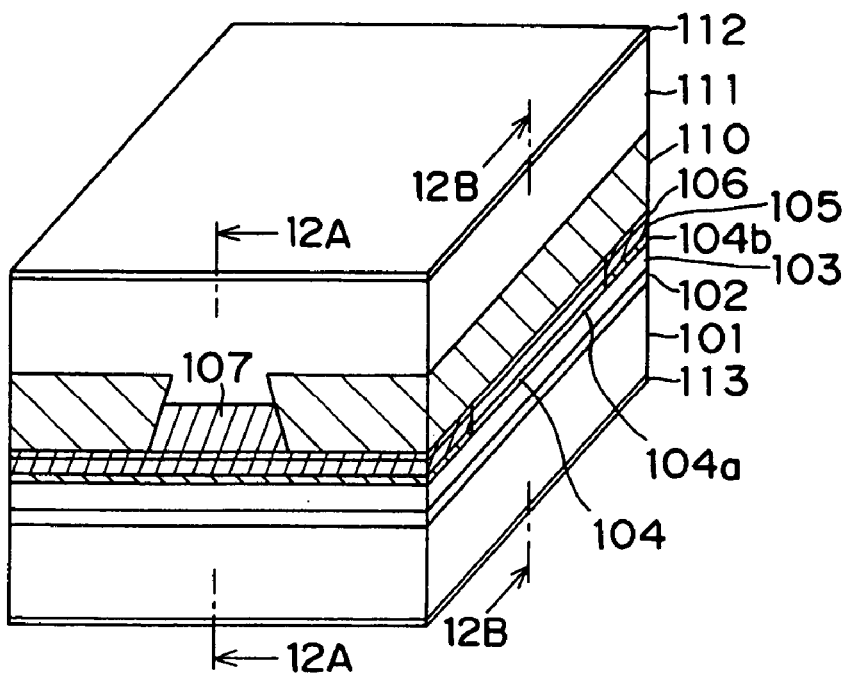
FIG. 11 is a perspective view of a semiconductor laser device according to a fourth embodiment of the present invention, showing a light emission end face of the device.
Figure 12A:
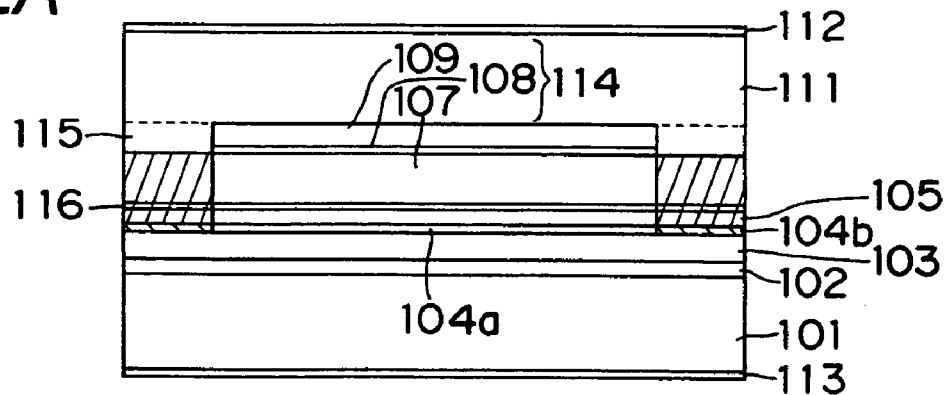
FIG. 12A is a cross-sectional view, taken along line 12A-12A of FIG. 11.
Figure 12B:
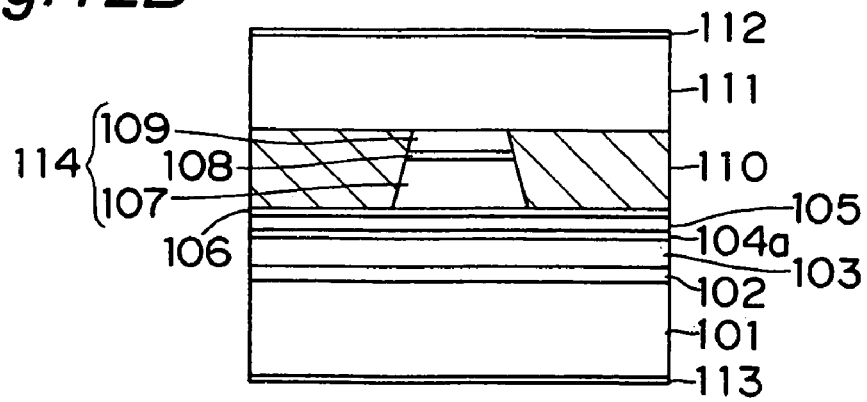
FIG. 12B is a cross-sectional view, taken along line 12B-12B of FIG. 11.

FIG. 11 is a perspective view of a semiconductor laser device according to a first embodiment of the present invention, showing a light emission end face of the device. FIG. 12A is a cross-sectional view taken along line 12A-12A of FIG. 11, showing parts including a waveguide. And, FIG. 12B is a cross-sectional view taken along line 12B-12B of FIG. 11.

In FIG. 11, reference numeral 101 denotes an n-type GaAs substrate (carrier concentration: $2 \times 10^{18}$ cm$^{-3}$), reference numeral 102 denotes an n-type $Ga_yIn_zP$ (0≦y, z≦1) buffer layer (carrier concentration: $1 \times 10^{18}$ cm$^{-3}$, y=0.515, z=0.485, film thickness: about 0.2 μm, and reference numeral 103 denotes an n-type $Al_xGa_yIn_zP$ ($0 \leq x \leq 1$) first cladding layer (carrier concentration: $1 \times 10^{18}$ cm$^{-3}$, x=0.360, y=0.155, z=0.485, film thickness: about 2 μm). Reference numeral 104 denotes an active layer (MQW active layer) constructed of a multiquantum well structure of alternating $Al_xGa_yIn_zP$ barrier layers (x=0.258, y=0.257, z=0.485; each having a film thickness of about 50 Å) and $Ga_yIn_zP$ well layers (y=0.485, z=0.515; each having a film thickness of about 50 Å), and two $Al_xGa_yIn_zP$ light guide layers (x=0.258, y=0.257, z=0.485, film thickness: about 500 Å) between which the multiquantum well structure is interposed. Of the MQW active layer 104, reference numeral 104a denotes an MQW active layer region inside of a laser cavity (hereinafter referred to as "active region"), and reference numeral 104b denotes an MQW active layer region which is in proximity of an end face of the laser cavity and which has a photoluminescence peak wavelength smaller than that of the active region 64a (hereinafter referred to as "window region").

Reference numeral 105 denotes a p-type $Al_xGa_yIn_zP$ second cladding layer (carrier concentration: $2 \times 10^{18}$ cm$^{-3}$, x=0.370, y=0.158, z=0.472, film thickness: about 0.1 μm), reference numeral 106 denotes a p-type etching stopper layer, reference numeral 107 denotes a p-type $Al_xGa_yIn_zP$ third cladding layer (carrier concentration: $2 \times 10^{18}$ cm$^{-3}$, x=0.370, y=0.158, z=0.472, film thickness: about 1.2 μm), reference numeral 108 denotes a p-type $Ga_yIn_zP$ intermediate layer (carrier concentration: $5 \times 10^{18}$ cm$^{-3}$, y=0.515, z=0.485 film thickness: about 0.05 μm), and reference numeral 109 denotes a p-type GaAs protective layer (carrier concentration: $1 \times 10^{19}$ cm$^{-3}$, film thickness: about 0.5 μm). That is, in the present embodiment, the p-type $Al_xGa_yIn_zP$ second cladding layer 105 and the p-type $Al_xGa_yIn_zP$ third cladding layer 107 constitute the second cladding layer recited in claims.

The p-type third cladding layer 107, the p-type intermediate layer 108 and the p-type protective layer 109 constitute a stripe-shaped ridge 114. Reference numeral 115 denotes a current non-injection region formed by removing the p-type intermediate layer 108 and the p-type protective layer 109. Si atoms are contained, as n-type impurities, in each of the layers from the n-type substrate 101 to the n-type first cladding layer 103, while Be atoms are contained, as p-type impurities, in each of the layers from the p-type second cladding layer 105 to the p-type protective layer 109.

Reference numeral 110 denotes an n-type $Al_xIn_zAs_\alpha P_\beta$ ($0 \leq \alpha, \beta \leq 1$) current block (constriction) layer (carrier concentration: $1 \times 10^{18}$ cm$^{-3}$, x=0.545, z=0.455, α=0-0.029, β=1-0.971, film thickness: about 1.2 μm). Reference numeral 111 denotes a p-type GaAs contact layer (carrier concentration: $1 \times 10^{19}$ cm$^{-3}$, film thickness: about 4 μm), reference numeral 112 denotes a p-side electrode, and reference numeral 113 denotes an n-side electrode.

In the semiconductor laser device, the n-type current block layer 110 has a lattice mismatch rate of −0.15% or more but not more than −0.05% relative to the n-type substrate 101. The lattice mismatch rate in the n-type current block layer 110 increases with the increasing distance from the p-type second cladding layer 105. In proximity of the p-type second cladding layer 105, the As mole fraction α of the n-type current block layer 110 is 0, and the Al mole fraction x and the In mole fraction thereof are fixed. In this case, the n-type current block layer 110 has a smaller lattice constant than that of the n-type substrate 101.

In the semiconductor laser device, the p-type second cladding layer 105 and the p-type third cladding layer 107 have a lattice mismatch rate of −0.05% relative to the n-type substrate 101. In this case, lattice constants of the p-type second cladding layer 105 and the p-type third cladding layer 107 are smaller than the lattice constant of the n-type substrate 101.

In the semiconductor laser device, the n-type buffer layer 102, the p-type etching stopper layer 106, the p-type intermediate layer 108 and the p-type protective layer 109 have a lattice mismatch rate of 0% relative to the n-type substrate 101. In this case, these layers have lattice constants a, equal to that of the n-type substrate 101.

In the semiconductor laser device, the n-type first cladding layer 103 has a lattice mismatch rate of +0.05% relative to the n-type substrate 101. The barrier layers and the light guide layers constituting parts of the MQW active layer 104 have a lattice mismatch rate of +0.03% relative to the n-type substrate 101. The well layers constituting the other parts of the MQW active layer 104 have a lattice mismatch rate of +0.22% relative to the n-type substrate 101. In this case, lattice constants of the n-type first cladding layer 103, the barrier layers, the well layers, the light guide layers, the p-type second cladding layer 105, and the p-type third cladding layer 107 are larger than the lattice constant $a_1$ of the n-type substrate 101.

In the n-type current block layer 110, the lattice mismatch rate ($\Delta a/a$) is given by adjusting the As mole fraction α of $Al_xIn_zAs_\alpha P_\beta$ constituting the current block layer 110.

The relationship between the lattice mismatch rate relative to the n-type substrate 101 and the Al, In, As, and P mole fractions will be described below. The relational expression for calculating the lattice mismatch rate ($\Delta a/a$) relative to the n-type substrate 101 from the Al, In, As, and P mole fractions is given by equation (3) below:

$$\Delta a/a = -3.45985 + 7.27Xz + 3.491X\alpha \quad (3)$$

If the In mole fraction z is set to z=0.455, the As mole fraction α of the n-type $Al_xIn_zAs_\alpha P_\beta$ current block layer 110 in proximity of the p-type second cladding layer 105 for the lattice mismatch rate of −0.15% is α=0 from equation (3). Therefore, the composition of the n-type current block layer 110 is $Al_{0.545}In_{0.455}P$. Further, with the In mole fraction set to z=0.455, the As mole fraction α of the n-type current block layer 110 for the lattice mismatch rate of −0.05% is α=0.029 from equation (3). Therefore, the composition of the n-type current block layer 110 is $Al_{0.545}In_{0.455}As_{0.029}P_{0.971}$.

Figure 13A:
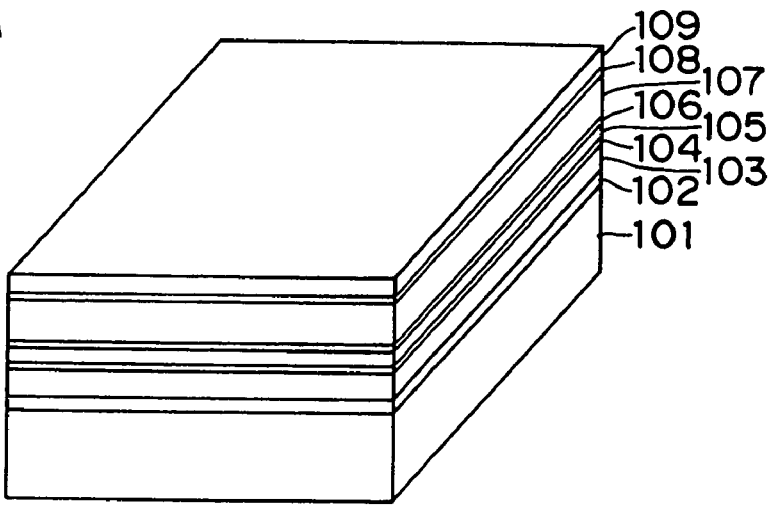
FIGS. 13A to 13F are cross-sectional views showing process steps in a method of producing the semiconductor laser device shown in FIG. 11.
Figure 13B:
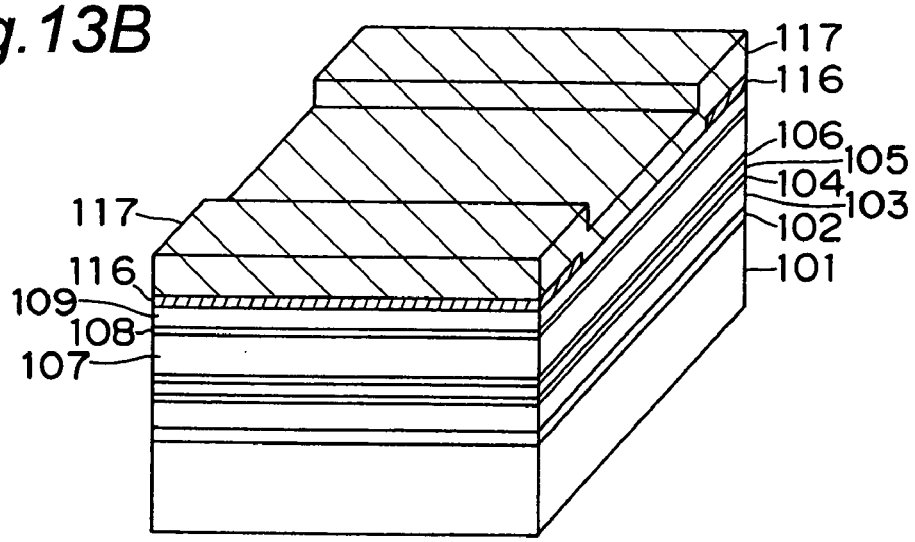

Next, a method of producing a semiconductor laser device with the above constitution will be described in accordance with FIGS. 13A-13F. First, as shown in FIG. 13A, an n-type $Ga_yIn_zP$ buffer layer 102, an n-type $Al_xGa_yIn_zP$ first cladding layer 103, a MQW active layer 104, a p-type $Al_xGa_yIn_zP$ second cladding layer 105, a p-type etching stopper layer 106, a p-type $Al_xGa_yIn_zP$ third cladding layer 107, a p-type $Ga_yIn_zP$ intermediate layer 108 and a p-type GaAs protective layer 49 are epitaxially grown on an n-type GaAs substrate 101 by the molecular beam epitaxy method.

During this process, the In mole fraction is controlled so that the p-type second cladding layer 105 and the p-type third cladding layer 107 have uniform lattice mismatch rates relative to the n-type GaAs substrate 101, respectively.

Next, using the known photolithography technique, a 60 μm wide stripe-shaped $Zn_vO_w$ (v, w ≧ 1) film 116 serving as an impurity diffusion source is formed on a surface of the p-type protective layer 109 in regions in proximity of end faces of a laser cavity ("laser cavity end face proximity regions") in such a manner that the stripes of the film 116 extend in a direction perpendicular to the ridge stripe. The $Zn_vO_w$ film 116 has a film thickness of 35 nm, and the pitch of the stripes is 800 μm, which is the same as the cavity length. Then, a $Si_tO_u$ (t, u≧1) film 177 that is a dielectric film is formed on the entire surface of the wafer having the $Zn_vO_w$ film 116, to have a film thickness of 200 nm.

Next, annealing is performed on the wafer of which the surface is covered with the $Si_tO_u$ dielectric film 177 in a nitrogen atmosphere under the condition that the temperature is 510° C. and the holding time is two hours. Thereby, in the laser cavity end face proximity regions, where the $Zn_vO_w$ impurity diffusion source film 116 is formed, Zn atoms from the $Zn_vO_w$ film 116 are diffused into the MQW active layer 104. At the same time, Be atoms contained in each of the layers from the p-type second cladding layer 105 to the p-type protective layer 109 are also diffused into the MQW active layer 104 so that the photoluminescence peak wavelength of the MQW active layer (window regions) 104b in the laser cavity end face proximity regions is made smaller than that of the MQW active layer (active region) 104a in the laser cavity internal region.

Using a part of the wafer after forming the active region 104a and the window regions 104b in the MQW active layer 104 by the annealing, the wavelengths of the MQW active layer (window regions) 104b in the laser cavity end face proximity regions and the MQW active layer (active region) 104a in the laser cavity internal region were measured by the PL method. As a result, it was confirmed that the emission spectrum from the window region 104b was shifted to the short wavelength side by 38 nm from the emission spectrum from the active region 104a.

Figure 13C:
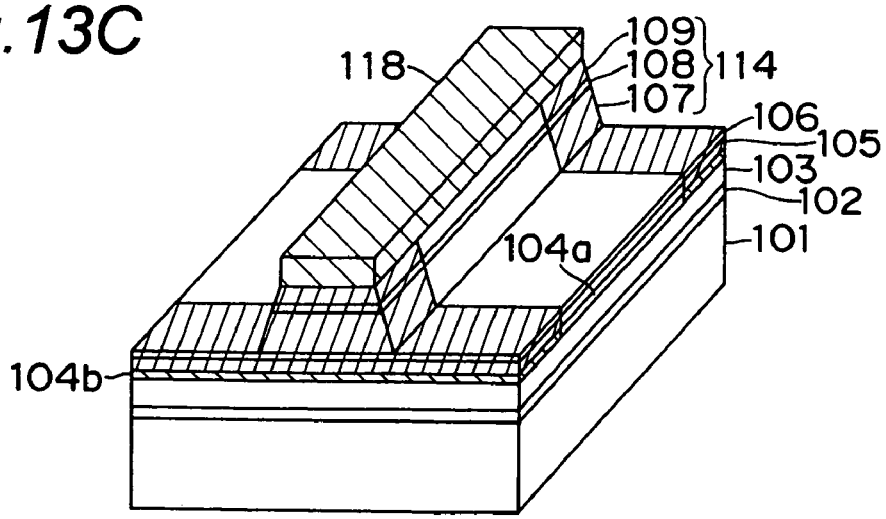

After that, the $Zn_vO_w$ film 116 and the $Si_tO_u$ film 117 formed on the p-type protective layer 109 are removed, and a stripe-shaped resist mask 118 extending in a direction perpendicular to the end faces of the laser cavity is formed on the p-type protective layer 109 using a known photolithography technique, as shown in FIG. 13C. Then, using the known etching technique, the p-type protective layer 109, the p-type intermediate layer 108 and the p-type third cladding layer 107 are etched until the p-type etching stopper layer 106 is reached, to form a stripe-shaped ridge 114 having a width of about 2 μm.

Figure 13D:
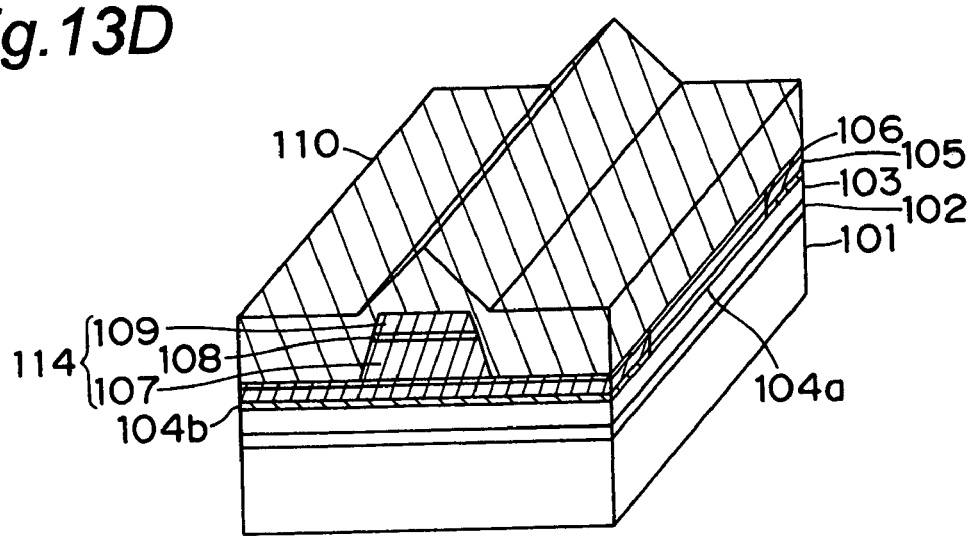

Next, the stripe-shaped resist mask 118 formed on the p-type protective layer 109 is removed, and both sides of the ridge 114 consisting of the p-type third cladding layer 107, the p-type intermediate layer 108 and the p-type protective layer 109 are filled with an n-type $Al_xIn_zAs_\alpha P_\beta$ current block layer 110 by performing the second MBE process, as shown in FIG. 13D. At this time, the lattice mismatch rate of the n-type current block layer 110 relative to the n-type substrate 101 is changed within the n-type current block layer 110. The lattice mismatch rate of the n-type current block layer 110 is controlled by setting first the As mole fraction α in the n-type $Al_xIn_zAs_\alpha P_\beta$ current block layer 110 in proximity of the p-type second cladding layer 105 to 0, and then changing the As mole fraction α, with the Al mole fraction x and the In mole fraction z fixed, so that the lattice mismatch rate increases as the distance from the p-type second cladding layer 105 increases.

Figure 13E:
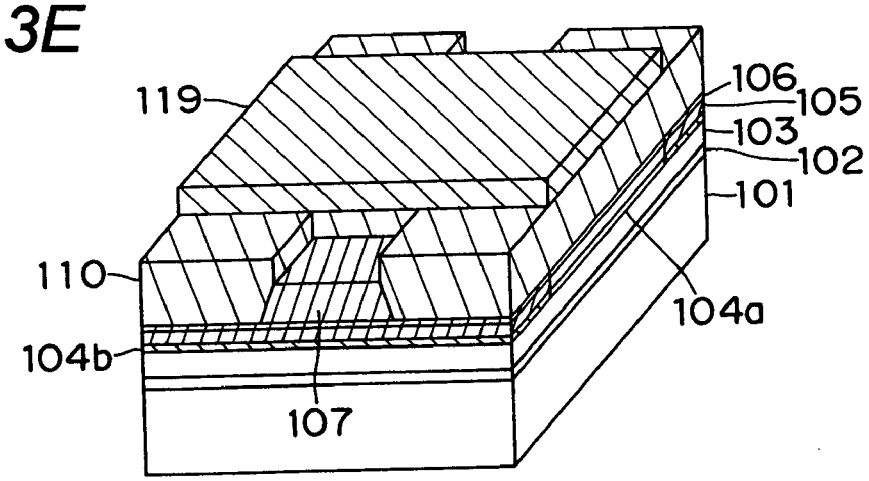

Thereafter, using a known photolithography technique, a resist mask (not shown) is formed on the n-type current block layer 110 at the lateral sides of the ridge 114. Then, using a known etching technique, only a part of the n-type current block layer 110 that is present at an opening of the resist mask and formed on the ridge 114 is selectively etched. After that, a resist mask 119 is formed such that a 740 μm wide resist mask stripe is formed at the laser cavity internal region, as shown in FIG. 13E, and the p-type protective layer 109 and the p-type intermediate layer 108 in openings of the resist mask 119, which are located in the laser cavity end face proximity regions, are selectively removed. The openings of the resist mask 119 are formed so as to be positioned immediately above the MQW active layer (window regions) 104b in the laser cavity end face proximity regions.

Thereby, there will occur a bandgap energy difference between the p-type third cladding layer 107 and a p-type contact layer 111 (to be formed later) in the laser cavity end face proximity regions occurs, so that current non-injection regions 115 will be formed. The thus formed current non-injection regions 115 will be positioned immediately above the window regions 104b. Therefore, current injection into the widow regions 104b is prevented, and reactive current not contributing to light emission is reduced.

Figure 13F:
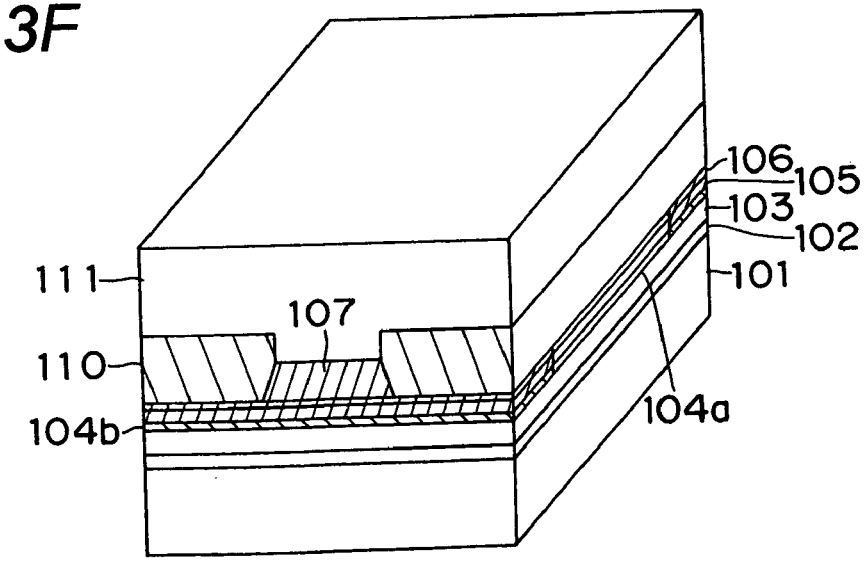
Figure 14:
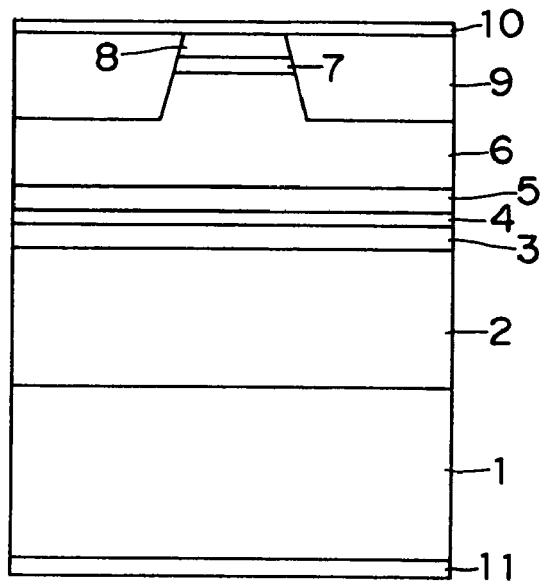
FIG. 14 is a cross-sectional view of a conventional AlGaInP semiconductor laser device that suppresses diffusion of impurity atoms into an active layer.
Figure 15A:
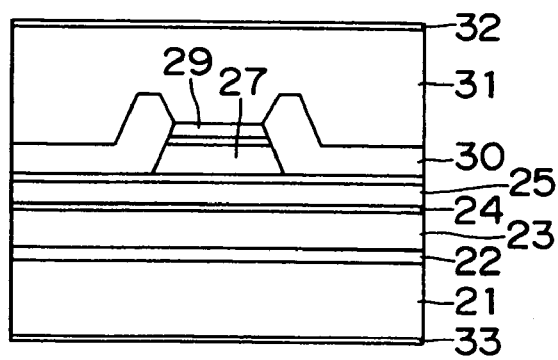
FIG. 15A and FIG. 15B are cross-sectional views of a conventional semiconductor laser device having a window structure, which reduces the COD level.
Figure 15B:
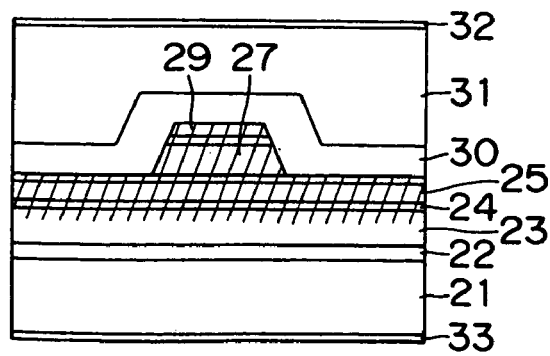
Figure 16A:
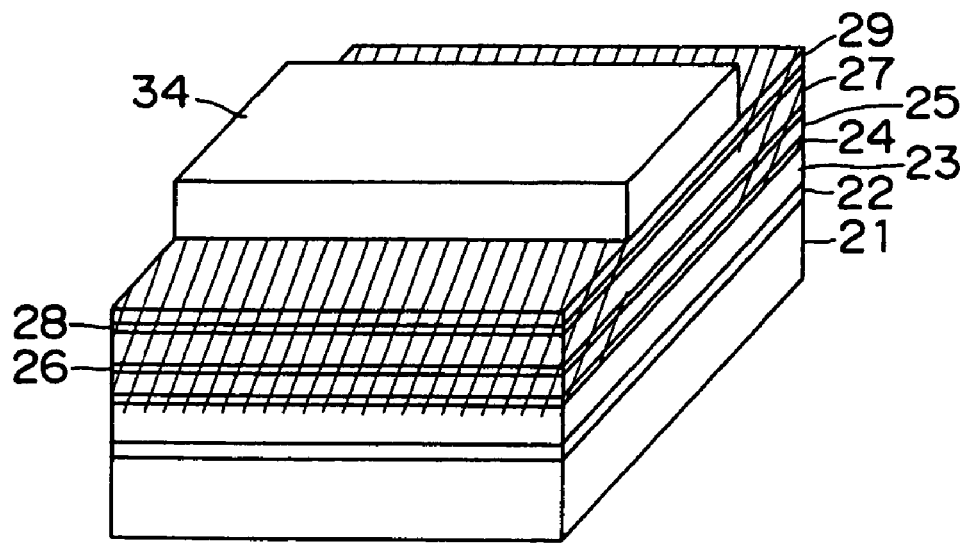
FIGS. 16A to 16D are cross-sectional views showing process steps in a conventional method of producing the conventional semiconductor laser device shown in FIG. 15A and FIG. 15B.
Figure 16B:
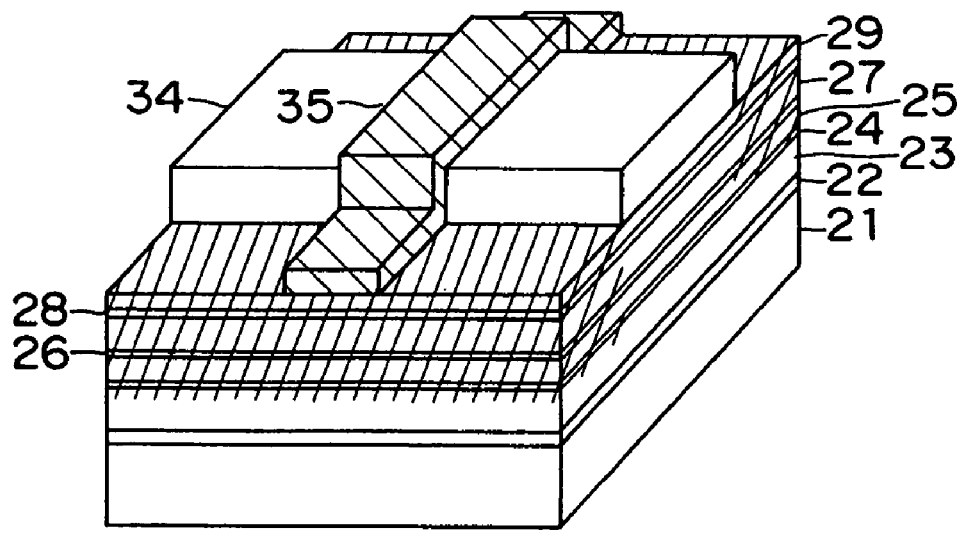
Figure 16C:
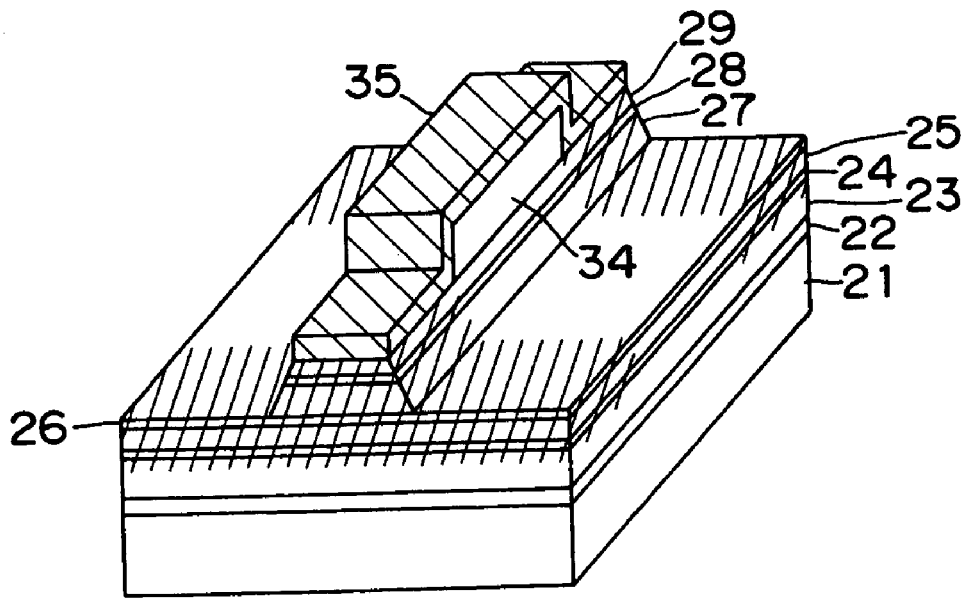
Figure 16D:
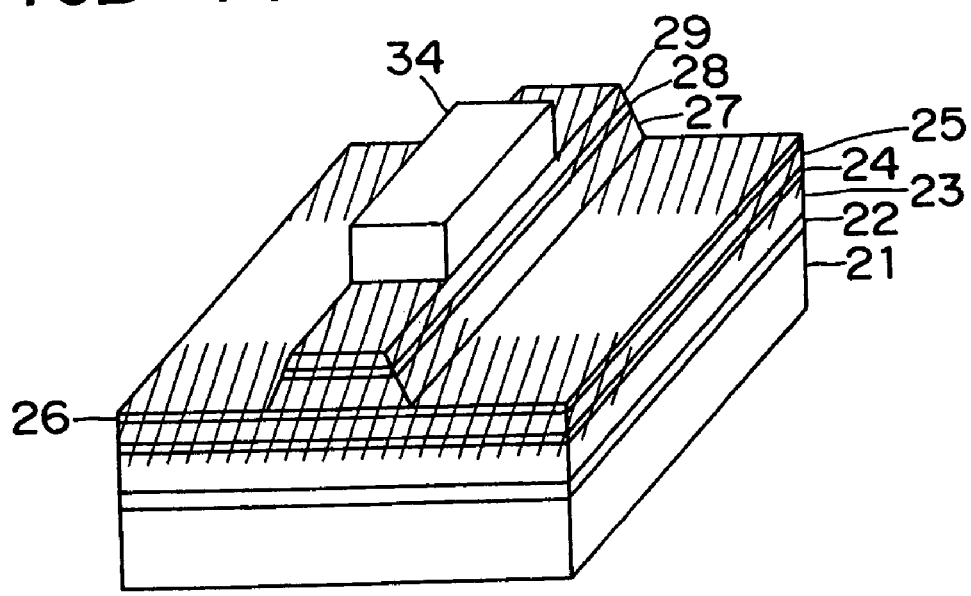

The resist mask 119 formed in the laser cavity internal region is then removed. Then, the p-type GaAs contact layer 111 is formed by the third MBE process, as shown in FIG. 13F. Further, although not shown, a p-side electrode 112 is formed on the top of the p-type contact layer 111, while an n-side electrode 113 is formed on the underside of the n-type substrate 101.

Next, the thus obtained wafer is scribed substantially at the center of the 60 μm wide laser cavity end face proximity regions, and divided into bars having the cavity length. Further, both sides of each bar serving as light emission end faces are coated with a reflection film. Then, the bars are divided into chips to form semiconductor laser devices each having about 30 μm wide window regions and current non-injection regions at the end faces of the laser cavity having a length of 800 μm.

The measurement of characteristics of semiconductor laser devices formed by the method of the present embodiment was conducted. For comparison, the measurement of characteristics of semiconductor laser devices of the second embodiment was also conducted.

First, the oscillation wavelength (λ) at CW 50 mW was measured. As a result, both the semiconductor laser devices of the present embodiment and the semiconductor laser devices of the second embodiment had an oscillation wavelength of 660 nm. Further, the driving current (Iop) at CW 50 mW was measured. As a result, both the semiconductor laser devices of the present embodiment and the semiconductor laser devices of the second embodiment had a driving current (Iop) of 85 mA. Maximum optical output tests were conducted. As a result, neither the semiconductor laser devices of the present embodiment nor the semiconductor laser devices of the second embodiment suffered from COD even at an optical output power of 300 mW or more.

COD did not occur in both of the semiconductor laser devices of the present embodiment and the semiconductor laser devices of the second embodiment even at an optical output power of 300 mW or more.

Furthermore, reliability tests at 70° C. and 50 mW were conducted on the semiconductor laser devices. While the semiconductor laser devices of the second embodiment had an average lifetime of about 2000 hours, the semiconductor laser devices of the present embodiment had an average lifetime of about 3000 hours, demonstrating that the average lifetime has improved.

It can be understood from the above that in a semiconductor laser device wherein the lattice mismatch rate of the n-type $Al_xIn_zAs_\alpha P_\beta$ current block layer 110 relative to the n-type substrate 101 changes within a range of from −0.15% to −0.05% so as to increase with the increasing distance from p-type second cladding layer 105, and wherein the As mole fraction α of the n-type $Al_xIn_zAs_\alpha P_\beta$ current block layer 110 in proximity of the p-type second cladding layer 105 is 0 with the Al mole fraction x and the In mole fraction z fixed, reduction of the driving current and further improvement in the long-term reliability have been realized.

The reduction of the driving current and the further improvement in the long-term reliability are realized by the following reason. That is, changing or varying the negative lattice mismatch rate within the n-type current block layer 110a contributes to partial introduction of a negative strain. Also, changing the As mole fraction α of the n-type $Al_xIn_zAs_\alpha P_\beta$ current block layer 110 so that the lattice mismatch rate therein increases with the increasing distance from the p-type second cladding layer 105 contributes to reduction of the lattice mismatch rate of the n-type current block layer 110 in proximity of the p-type second cladding layer 105. That is, though a negative strain is indirectly provided in the p-type second cladding layer 105, a negative strain introduced into the MQW active layer 104 is reduced. As a result, diffusion of Be atoms into the active layer is reduced, and deterioration of crystallinity in the MQW active layer 104 is suppressed.

In the present embodiment, the lattice mismatch rate of the n-type current block layer 110 relative to the n-type substrate 101 is set to −0.15% to −0.05%, the lattice mismatch rate increases as the distance from the p-type second cladding layer 105 increases, the As mole fraction α of the n-type $Al_xIn_zAs_\alpha P_\beta$ current block layer 110 in proximity of the p-type second cladding layer 105 is 0, and the Al mole fraction and the In mole fraction are fixed. However, the effect of the present embodiment can also be obtained if the lattice mismatch rate of the n-type current block layer 110 relative to the n-type substrate 101 is set within the range of −0.20% or more but not more than 0%, preferably −0.15% or more but not more than −0.05%, and if the lattice mismatch rate is adjusted so as to increase with the increasing distance from the p-type second cladding layer 105, with the As mole fraction α of the n-type current block layer 110 in proximity of the p-type second cladding layer 105 being 0 and with the Al mole fraction x and the In mole fraction z fixed.

According to the present embodiment, in a window structure semiconductor laser device in which the photoluminescence peak wavelength of the MQW active layer (window regions) 104b in the laser cavity end face proximity regions is made smaller than that of the MQW active layer (active region) 104a in the laser cavity internal region, the lattice mismatch rate of the n-type first current block layer 110 relative to the n-type substrate 101 is set to −0.15% to −0.05% so that the lattice mismatch rate increases as the distance from p-type second cladding layer 105 increases, the As mole fraction α of the n-type $Al_xIn_zAs_\alpha P_\beta$ in proximity of the p-type second cladding layer 105 is 0, and the Al mole fraction x and the In mole fraction z are fixed. However, the invention is not limited to this, and in the semiconductor laser device of the first embodiment as well, the effect of the present embodiment can also be obtained if the lattice mismatch rate of the n-type current block layer 50 relative to the n-type substrate 41 is set within the range of −0.20% or more but not more than 0%, preferably −0.15% or more but not more than −0.05%, and if the lattice mismatch rate is adjusted so as to increase with the increasing distance from the p-type second cladding layer 45, with the Al mole fraction x and the In mole fraction z of the n-type $Al_xIn_zP$ current block layer 50 in proximity of the p-type second cladding layer 45 being fixed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An AlGaInP semiconductor laser device comprising at least a first conductivity type first cladding layer, an active layer and a second conductivity type second cladding layer formed on a semiconductor substrate, said second conductivity type second cladding layer having a stripe-shaped ridge on a side opposite from the substrate, said device having a first conductivity type current block layer formed directly above the active layer and on both lateral sides of the ridge, wherein
    the first conductivity type current block layer has a lattice mismatch rate greater than or equal to −0.20%, and less than or equal to −0.05%, relative to the semiconductor substrate.

2. The semiconductor laser device according to claim 1, wherein
    a photoluminescence peak wavelength of the active layer in a laser cavity end face proximity region is smaller than a photoluminescence peak wavelength of the active layer in a laser cavity internal region.

3. The semiconductor laser device according to claim 1, wherein
    the lattice mismatch rate of the first conductivity type current block layer relative to the semiconductor substrate is uniform within the current block layer.

4. The semiconductor laser device according to claim 1, wherein
    the lattice mismatch rate of the first conductivity type current block layer relative to the semiconductor substrate changes within the current block layer.

5. An AlGaInP semiconductor laser device comprising at least a first conductivity type first cladding layer, an active layer and a second conductivity type second cladding layer formed on a semiconductor substrate, said second conductivity type second cladding layer having a stripe-shaped ridge on a side opposite from the substrate, said device having a first conductivity type current block layer formed directly above the active layer and on both lateral sides of the ridge, wherein
    the first conductivity type current block layer has a lattice mismatch rate in a range of from −0.20%, to 0%, inclusive, relative to the semiconductor substrate,
    the lattice mismatch rate of the first conductivity type current block layer relative to the semiconductor substrate changes within the current block layer, and
    the lattice mismatch rate of the first conductivity type current block layer relative to the semiconductor substrate increases with an increasing distance thereof from a portion of the second conductivity type second cladding layer other than the ridge.

6. The semiconductor laser device according to claim 5, wherein
    the lattice mismatch rate of the first conductivity type current block layer changes stepwise within the current block layer.

7. The semiconductor laser device according to claim 1, wherein
    the first conductivity type current block layer is composed of $Al_xIn_zP$ ($0 \leq x \leq 1$, $0 \leq z \leq 1$).

8. The semiconductor laser device according to claim 5, wherein
    the first conductivity type current block layer is composed of $Al_xIn_zAs_\alpha P_\beta$ ($0 \leq x \leq 1$, $0 \leq z \leq 1$, $0 \leq \alpha \leq 1$, $0 \leq \beta \leq 1$).

9. The semiconductor laser device according to claim 8, wherein
    an Al mole fraction x and an In mole fraction z in the current block layer are fixed, and an As mole fraction α in the current block layer in proximity of the second conductivity type second cladding layer is 0.

10. The semiconductor laser device according to claim 1, wherein impurity atoms contained in the second conductivity type second cladding layer are Be atoms.

11. The semiconductor laser device according to claim1, wherein the second conductivity type second cladding layer has a lattice mismatch rate of −0.15% or more but not more than 0.05% relative to the semiconductor substrate.

12. The semiconductor laser device according to claim 1, wherein the lattice mismatch rate of the first conductivity type current block layer is smaller than a lattice mismatch rate of the second conductivity type second cladding layer.

* * * * *